(12) United States Patent
Bean, Jr.

(10) Patent No.: US 8,424,336 B2
(45) Date of Patent: Apr. 23, 2013

(54) MODULAR ICE STORAGE FOR UNINTERRUPTIBLE CHILLED WATER

(75) Inventor: John H. Bean, Jr., Wentzville, MO (US)

(73) Assignee: Schneider Electric IT Corporation, West Kingston, RI (US)

( * ) Notice: Subject to any disclaimer, the term of this patent is extended or adjusted under 35 U.S.C. 154(b) by 432 days.

(21) Appl. No.: 12/726,934

(22) Filed: Mar. 18, 2010

(65) Prior Publication Data

US 2010/0170663 A1 Jul. 8, 2010

Related U.S. Application Data

(63) Continuation of application No. 11/640,650, filed on Dec. 18, 2006, now Pat. No. 7,681,404.

(51) Int. Cl.
*F25D 17/02* (2006.01)

(52) U.S. Cl.
USPC ............................................. 62/434; 62/435

(58) Field of Classification Search ............ 62/3.2, 62/3.3, 3.7, 59, 259.2, 434, 435, 459, 306, 62/332, 333; 165/80.4, 104.33; 361/699
See application file for complete search history.

(56) References Cited

U.S. PATENT DOCUMENTS

| | | | |
|---|---|---|---|
| 1,025,243 A | 5/1912 | Carpenter et al. | |
| 1,941,258 A | 12/1933 | Gordon | |
| 2,455,022 A | 11/1948 | Schmidt | |
| 3,317,798 A | 5/1967 | Chu et al. | |
| 3,559,728 A | 2/1971 | Lyman | |
| 3,643,077 A | 2/1972 | Roberts et al. | |
| 3,681,936 A | 8/1972 | Park | |
| 3,742,725 A | 7/1973 | Berger | |
| 3,995,446 A | 12/1976 | Eubank | |
| 4,055,053 A | 10/1977 | Elfving et al. | |
| 4,127,008 A | 11/1978 | Tyree, Jr. | |
| 4,197,716 A | 4/1980 | Nussbaum | |
| 4,223,535 A * | 9/1980 | Kumm | 62/235.1 |
| 4,275,570 A | 6/1981 | Szymaszek et al. | |
| 4,285,205 A | 8/1981 | Martin et al. | |
| 4,419,865 A | 12/1983 | Szymaszek | |

(Continued)

FOREIGN PATENT DOCUMENTS

| | | |
|---|---|---|
| CN | 1485906 A | 3/2004 |
| CN | 2612211 Y | 4/2004 |

(Continued)

OTHER PUBLICATIONS

"Essential Cooling System Requirements for Next Generation Data Centers," White Paper #5, , Revision 3, Rev 2002-3, American Power Conversion, pp. 1-10.

(Continued)

*Primary Examiner* — Mohammad Ali
(74) *Attorney, Agent, or Firm* — Lando & Anastasi, LLP

(57) ABSTRACT

A backup cooling storage system comprising at least one cooling and storage unit configured to cool a liquid supply using a quantity of cooled material when a main chiller of the liquid supply is not operational, and at least one chilling element configured to generate the quantity of cooled material for the at least one cooling and storage unit when the main chiller of the liquid supply is operational. Additional embodiments and methods are further disclosed.

11 Claims, 9 Drawing Sheets

U.S. PATENT DOCUMENTS

| | | | |
|---|---|---|---|
| 4,515,746 A | 5/1985 | Brun et al. | |
| 4,590,538 A | 5/1986 | Cray, Jr. | |
| 4,599,873 A | 7/1986 | Hyde | |
| 4,696,168 A | 9/1987 | Woods et al. | |
| 4,718,249 A * | 1/1988 | Hanson | 62/263 |
| 4,747,041 A | 5/1988 | Engel et al. | |
| 4,774,631 A | 9/1988 | Okuyama et al. | |
| 4,823,247 A | 4/1989 | Tamoto | |
| 4,823,290 A | 4/1989 | Fasack et al. | |
| 4,827,151 A | 5/1989 | Okado | |
| 4,827,733 A | 5/1989 | Dinh | |
| 4,831,508 A | 5/1989 | Hunter | |
| 4,837,663 A | 6/1989 | Zushi et al. | |
| 4,911,231 A | 3/1990 | Horne et al. | |
| 4,937,505 A | 6/1990 | Deglon et al. | |
| 4,944,158 A | 7/1990 | Akiike et al. | |
| 4,962,734 A | 10/1990 | Jorgensen | |
| 4,980,812 A | 12/1990 | Johnson, Jr. et al. | |
| 5,017,800 A | 5/1991 | Divan | |
| 5,019,717 A | 5/1991 | McCurry et al. | |
| 5,057,968 A | 10/1991 | Morrison | |
| 5,095,712 A | 3/1992 | Narreau | |
| 5,097,328 A | 3/1992 | Boyette | |
| 5,126,585 A | 6/1992 | Boys | |
| 5,150,580 A | 9/1992 | Hyde | |
| 5,153,837 A | 10/1992 | Shaffer et al. | |
| 5,158,132 A | 10/1992 | Guillemot | |
| 5,168,724 A | 12/1992 | Gilbertson et al. | |
| 5,173,819 A | 12/1992 | Takahashi et al. | |
| 5,177,666 A | 1/1993 | Bland et al. | |
| 5,181,653 A | 1/1993 | Foster et al. | |
| 5,195,706 A | 3/1993 | Allen | |
| 5,216,623 A | 6/1993 | Barrett et al. | |
| 5,234,185 A | 8/1993 | Hoffman et al. | |
| 5,269,372 A | 12/1993 | Chu et al. | |
| 5,367,670 A | 11/1994 | Ward et al. | |
| 5,381,554 A | 1/1995 | Langer et al. | |
| 5,382,943 A | 1/1995 | Tanaka | |
| 5,388,422 A | 2/1995 | Hayashida et al. | |
| 5,404,136 A | 4/1995 | Marsden | |
| 5,462,225 A | 10/1995 | Massara et al. | |
| 5,507,529 A | 4/1996 | Martins | |
| 5,519,306 A | 5/1996 | Itoh et al. | |
| 5,528,507 A | 6/1996 | McNamara et al. | |
| 5,533,357 A | 7/1996 | Voorhis | |
| 5,572,873 A * | 11/1996 | Lavigne et al. | 62/3.62 |
| 5,581,478 A | 12/1996 | Cruse et al. | |
| 5,582,020 A | 12/1996 | Scaringe et al. | |
| 5,649,428 A | 7/1997 | Calton et al. | |
| 5,654,591 A | 8/1997 | Mabboux et al. | |
| 5,657,641 A | 8/1997 | Cunningham et al. | |
| 5,682,949 A | 11/1997 | Ratcliffe et al. | |
| 5,684,686 A | 11/1997 | Reddy | |
| 5,694,780 A | 12/1997 | Alsenz | |
| 5,704,219 A | 1/1998 | Suzuki et al. | |
| 5,718,628 A | 2/1998 | Nakazato et al. | |
| 5,735,134 A | 4/1998 | Liu et al. | |
| 5,749,237 A | 5/1998 | Sandofsky et al. | |
| 5,794,897 A | 8/1998 | Jobin et al. | |
| 5,802,856 A | 9/1998 | Schaper et al. | |
| 5,845,090 A | 12/1998 | Collins, III et al. | |
| 5,850,539 A | 12/1998 | Cook et al. | |
| 5,860,012 A | 1/1999 | Luu | |
| 5,860,280 A | 1/1999 | Recine, Sr. et al. | |
| 5,896,922 A | 4/1999 | Chrysler et al. | |
| 5,949,974 A | 9/1999 | Ewing et al. | |
| 5,953,930 A | 9/1999 | Chu et al. | |
| 5,954,127 A | 9/1999 | Chrysler et al. | |
| 5,959,240 A | 9/1999 | Yoshida et al. | |
| 5,960,204 A | 9/1999 | Yinger et al. | |
| 5,963,425 A | 10/1999 | Chrysler et al. | |
| 5,963,457 A | 10/1999 | Kanoi et al. | |
| 5,970,731 A | 10/1999 | Hare et al. | |
| 5,970,734 A | 10/1999 | Stillwell et al. | |
| 5,972,196 A | 10/1999 | Murphy et al. | |
| 5,974,237 A | 10/1999 | Shurmer et al. | |
| 5,978,594 A | 11/1999 | Bonnell et al. | |
| 5,978,912 A | 11/1999 | Rakavy et al. | |
| 5,982,652 A | 11/1999 | Simonelli et al. | |
| 5,984,144 A | 11/1999 | Wyatt | |
| 5,987,614 A | 11/1999 | Mitchell et al. | |
| 5,995,729 A | 11/1999 | Hirosawa et al. | |
| 6,023,935 A | 2/2000 | Okazaki et al. | |
| 6,032,472 A | 3/2000 | Heinrichs et al. | |
| 6,034,872 A | 3/2000 | Chrysler et al. | |
| 6,038,879 A | 3/2000 | Turcotte et al. | |
| 6,055,480 A | 4/2000 | Nevo et al. | |
| 6,085,243 A | 7/2000 | Fletcher et al. | |
| 6,104,868 A | 8/2000 | Peters et al. | |
| 6,105,061 A | 8/2000 | Nakai | |
| 6,108,782 A | 8/2000 | Fletcher et al. | |
| 6,111,036 A | 8/2000 | Wonders et al. | |
| 6,112,235 A | 8/2000 | Spofford | |
| 6,134,511 A | 10/2000 | Subbarao | |
| 6,141,762 A | 10/2000 | Nicol et al. | |
| 6,189,109 B1 | 2/2001 | Sheikh et al. | |
| 6,199,204 B1 | 3/2001 | Donohue | |
| 6,208,510 B1 | 3/2001 | Trudeau et al. | |
| 6,209,330 B1 * | 4/2001 | Timmerman et al. | 62/179 |
| 6,213,194 B1 | 4/2001 | Chrysler et al. | |
| 6,216,482 B1 | 4/2001 | Xiao et al. | |
| 6,216,956 B1 | 4/2001 | Ehlers et al. | |
| 6,223,810 B1 | 5/2001 | Chu et al. | |
| 6,237,353 B1 | 5/2001 | Sishtla et al. | |
| 6,246,969 B1 | 6/2001 | Sinclair et al. | |
| 6,266,721 B1 | 7/2001 | Sheikh et al. | |
| 6,276,161 B1 * | 8/2001 | Peiffer et al. | 62/406 |
| 6,281,790 B1 | 8/2001 | Kimmel et al. | |
| 6,305,180 B1 | 10/2001 | Miller et al. | |
| 6,322,202 B1 | 11/2001 | Ahn | |
| 6,327,143 B1 | 12/2001 | Bonstrom et al. | |
| 6,332,335 B1 * | 12/2001 | Kajimoto et al. | 62/434 |
| 6,347,627 B1 | 2/2002 | Frankie et al. | |
| 6,363,421 B2 | 3/2002 | Barker et al. | |
| 6,374,627 B1 | 4/2002 | Schumacher et al. | |
| 6,381,700 B1 | 4/2002 | Yoshida | |
| 6,389,464 B1 | 5/2002 | Krishnamurthy et al. | |
| 6,415,628 B1 * | 7/2002 | Ahmed et al. | 62/534 |
| 6,438,978 B1 | 8/2002 | Bessler | |
| 6,457,076 B1 | 9/2002 | Cheng et al. | |
| 6,459,579 B1 | 10/2002 | Farmer et al. | |
| 6,474,087 B1 | 11/2002 | Lifson | |
| 6,483,730 B2 | 11/2002 | Johnson, Jr. | |
| 6,494,050 B2 | 12/2002 | Spinazzola et al. | |
| 6,557,624 B1 | 5/2003 | Stahl et al. | |
| 6,574,104 B2 | 6/2003 | Patel et al. | |
| 6,575,234 B2 * | 6/2003 | Nelson | 165/247 |
| 6,640,889 B1 * | 11/2003 | Harte et al. | 165/202 |
| 6,661,678 B2 | 12/2003 | Raddi et al. | |
| 6,662,576 B1 | 12/2003 | Bai | |
| 6,668,565 B1 | 12/2003 | Johnson et al. | |
| 6,672,955 B2 | 1/2004 | Charron | |
| 6,682,100 B2 | 1/2004 | Wood et al. | |
| 6,694,759 B1 | 2/2004 | Bash et al. | |
| 6,695,577 B1 | 2/2004 | Susek | |
| 6,714,977 B1 | 3/2004 | Fowler et al. | |
| 6,718,277 B2 | 4/2004 | Sharma | |
| 6,718,781 B2 | 4/2004 | Freund et al. | |
| 6,721,672 B2 | 4/2004 | Spitaels et al. | |
| 6,745,579 B2 | 6/2004 | Spinazzola et al. | |
| 6,745,590 B1 | 6/2004 | Johnson et al. | |
| 6,761,212 B2 | 7/2004 | DiPaolo | |
| 6,775,137 B2 | 8/2004 | Chu et al. | |
| 6,795,928 B2 | 9/2004 | Bradley et al. | |
| 6,804,616 B2 | 10/2004 | Bodas | |
| 6,804,975 B2 | 10/2004 | Park | |
| 6,814,134 B1 | 11/2004 | Pravda | |
| 6,819,563 B1 | 11/2004 | Chu et al. | |
| 6,827,142 B2 * | 12/2004 | Winkler et al. | 165/298 |
| 6,829,630 B1 | 12/2004 | Pajak et al. | |
| 6,832,504 B1 | 12/2004 | Birkmann | |
| 6,848,989 B2 | 2/2005 | Miyazaki et al. | |
| 6,859,366 B2 | 2/2005 | Fink | |
| 6,859,882 B2 | 2/2005 | Fung | |
| 6,862,179 B2 | 3/2005 | Beitelmal et al. | |
| 6,880,349 B2 | 4/2005 | Johnson et al. | |
| 6,881,142 B1 | 4/2005 | Nair | |

| Patent/Pub No. | Date | Name |
|---|---|---|
| 6,886,353 B2 | 5/2005 | Patel et al. |
| 6,901,767 B2 | 6/2005 | Wood |
| 6,924,981 B2 | 8/2005 | Chu et al. |
| 6,927,980 B2 | 8/2005 | Fukuda et al. |
| 6,944,035 B2 | 9/2005 | Raddi et al. |
| 6,955,058 B2 | 10/2005 | Taras et al. |
| 6,959,558 B2 | 11/2005 | Bean, Jr. et al. |
| 6,964,539 B2 | 11/2005 | Bradley et al. |
| 6,967,283 B2 | 11/2005 | Rasmussen et al. |
| 6,967,841 B1 | 11/2005 | Chu et al. |
| 6,973,797 B2 | 12/2005 | Nemit, Jr. |
| 6,973,801 B1 | 12/2005 | Campbell et al. |
| 6,980,433 B2 | 12/2005 | Fink |
| 7,000,416 B2 | 2/2006 | Hirooka et al. |
| 7,000,467 B2 | 2/2006 | Chu et al. |
| 7,012,807 B2 | 3/2006 | Chu et al. |
| 7,012,825 B2 | 3/2006 | Nielsen |
| 7,020,586 B2 | 3/2006 | Snevely |
| 7,031,870 B2 | 4/2006 | Sharma et al. |
| 7,032,119 B2 | 4/2006 | Fung |
| 7,033,267 B2 | 4/2006 | Rasmussen |
| 7,046,514 B2 | 5/2006 | Fink et al. |
| 7,047,300 B1 | 5/2006 | Oehrke et al. |
| 7,051,802 B2 | 5/2006 | Baer |
| 7,051,946 B2 | 5/2006 | Bash et al. |
| 7,065,600 B2 | 6/2006 | Papa et al. |
| 7,082,541 B2 | 7/2006 | Hammond et al. |
| 7,085,133 B2 | 8/2006 | Hall |
| 7,086,247 B2 | 8/2006 | Campbell et al. |
| 7,091,625 B2 | 8/2006 | Okusawa et al. |
| 7,104,081 B2 | 9/2006 | Chu et al. |
| 7,106,590 B2 | 9/2006 | Chu et al. |
| 7,112,131 B2 | 9/2006 | Rasmussen et al. |
| 7,120,021 B2 | 10/2006 | Hamman |
| 7,120,689 B2 | 10/2006 | Gonsalves et al. |
| 7,140,193 B2 | 11/2006 | Johnson et al. |
| 7,145,772 B2 | 12/2006 | Fink |
| 7,146,353 B2 | 12/2006 | Garg et al. |
| 7,148,796 B2 | 12/2006 | Joy et al. |
| 7,155,318 B2 | 12/2006 | Sharma et al. |
| 7,165,412 B1 | 1/2007 | Bean, Jr. |
| 7,173,820 B2 | 2/2007 | Fink et al. |
| 7,184,269 B2 | 2/2007 | Campbell et al. |
| 7,187,549 B2 | 3/2007 | Teneketges et al. |
| 7,197,433 B2 | 3/2007 | Patel et al. |
| 7,228,707 B2 | 6/2007 | Lifson et al. |
| 7,236,363 B2 | 6/2007 | Belady |
| 7,251,547 B2 | 7/2007 | Bash et al. |
| 7,254,307 B2 | 8/2007 | Xin |
| 7,259,963 B2 | 8/2007 | Germagian et al. |
| 7,270,174 B2 | 9/2007 | Chu et al. |
| 7,272,005 B2 | 9/2007 | Campbell et al. |
| 7,274,566 B2 | 9/2007 | Campbell et al. |
| 7,278,273 B1 | 10/2007 | Whitted et al. |
| 7,284,379 B2 | 10/2007 | Pham et al. |
| 7,292,898 B2 | 11/2007 | Clark et al. |
| 7,293,666 B2 | 11/2007 | Mattlin et al. |
| 7,298,617 B2 | 11/2007 | Campbell et al. |
| 7,298,618 B2 | 11/2007 | Campbell et al. |
| 7,313,503 B2 | 12/2007 | Nakagawa et al. |
| 7,315,448 B1 | 1/2008 | Bash et al. |
| 7,319,594 B2 | 1/2008 | Nicolai et al. |
| 7,365,973 B2 | 4/2008 | Rasmussen et al. |
| 7,366,632 B2 | 4/2008 | Hamann et al. |
| 7,403,391 B2 | 7/2008 | Germagian et al. |
| 7,406,839 B2 | 8/2008 | Bean et al. |
| 7,418,825 B1 | 9/2008 | Bean, Jr. |
| 7,426,453 B2 | 9/2008 | Patel et al. |
| 7,462,453 B2 | 12/2008 | Yamada et al. |
| 7,472,043 B1 | 12/2008 | Low et al. |
| 7,558,649 B1 | 7/2009 | Sharma et al. |
| 7,568,360 B1 | 8/2009 | Bash et al. |
| 7,596,476 B2 | 9/2009 | Rasmussen et al. |
| 7,620,480 B2 | 11/2009 | Patel et al. |
| 7,676,280 B1 | 3/2010 | Bash et al. |
| 7,681,404 B2 | 3/2010 | Bean, Jr. |
| 7,705,489 B2 | 4/2010 | Nielsen et al. |
| 7,726,144 B2 | 6/2010 | Larson et al. |
| 7,775,055 B2 | 8/2010 | Bean et al. |
| 7,881,910 B2 | 2/2011 | Rasmussen et al. |
| 7,885,795 B2 | 2/2011 | Rasmussen et al. |
| 7,979,250 B2 | 7/2011 | Archibald et al. |
| 2001/0005894 A1 | 6/2001 | Fukui |
| 2001/0042616 A1 | 11/2001 | Baer |
| 2001/0047213 A1 | 11/2001 | Sepe |
| 2001/0047387 A1 | 11/2001 | Brockhurst |
| 2001/0047410 A1 | 11/2001 | Defosse |
| 2001/0052006 A1 | 12/2001 | Barker et al. |
| 2001/0055965 A1 | 12/2001 | Delp et al. |
| 2002/0004912 A1 | 1/2002 | Fung |
| 2002/0023258 A1 | 2/2002 | Elwahab et al. |
| 2002/0043969 A1 | 4/2002 | Duncan et al. |
| 2002/0055909 A1 | 5/2002 | Fung et al. |
| 2002/0059804 A1 | 5/2002 | Spinazzola et al. |
| 2002/0062454 A1 | 5/2002 | Fung |
| 2002/0071031 A1 | 6/2002 | Lord et al. |
| 2002/0072868 A1 | 6/2002 | Bartone et al. |
| 2002/0112054 A1 | 8/2002 | Hatanaka |
| 2002/0124081 A1 | 9/2002 | Primm et al. |
| 2002/0129355 A1 | 9/2002 | Velten et al. |
| 2002/0130648 A1 | 9/2002 | Raddi et al. |
| 2002/0134096 A1 | 9/2002 | Shim et al. |
| 2002/0134567 A1 | 9/2002 | Rasmussen et al. |
| 2002/0161885 A1 | 10/2002 | Childers et al. |
| 2003/0019221 A1 | 1/2003 | Rossi et al. |
| 2003/0033550 A1 | 2/2003 | Kuiawa et al. |
| 2003/0042004 A1 | 3/2003 | Novotny et al. |
| 2003/0084357 A1 | 5/2003 | Bresniker et al. |
| 2003/0084358 A1 | 5/2003 | Bresniker et al. |
| 2003/0084359 A1 | 5/2003 | Bresniker et al. |
| 2003/0115000 A1 | 6/2003 | Bodas |
| 2003/0115024 A1 | 6/2003 | Snevely |
| 2003/0120780 A1 | 6/2003 | Zhu et al. |
| 2003/0121689 A1 | 7/2003 | Rasmussen et al. |
| 2003/0147214 A1* | 8/2003 | Patel et al. ............ 361/699 |
| 2003/0147216 A1 | 8/2003 | Patel et al. |
| 2003/0154285 A1 | 8/2003 | Berglund et al. |
| 2003/0158718 A1 | 8/2003 | Nakagawa et al. |
| 2003/0184975 A1 | 10/2003 | Steinman et al. |
| 2003/0188208 A1 | 10/2003 | Fung |
| 2003/0193777 A1 | 10/2003 | Friedrich et al. |
| 2003/0196126 A1 | 10/2003 | Fung |
| 2003/0200130 A1 | 10/2003 | Kall et al. |
| 2003/0200295 A1 | 10/2003 | Roberts et al. |
| 2003/0200473 A1 | 10/2003 | Fung |
| 2003/0204756 A1 | 10/2003 | Ransom et al. |
| 2003/0236822 A1 | 12/2003 | Graupner et al. |
| 2004/0003266 A1 | 1/2004 | Moshir et al. |
| 2004/0010569 A1 | 1/2004 | Thomas et al. |
| 2004/0016243 A1 | 1/2004 | Song et al. |
| 2004/0020224 A1 | 2/2004 | Bash et al. |
| 2004/0031280 A1* | 2/2004 | Martin et al. ............ 62/246 |
| 2004/0031282 A1* | 2/2004 | Kopko ............ 62/271 |
| 2004/0061030 A1 | 4/2004 | Goodwin et al. |
| 2004/0065097 A1 | 4/2004 | Bash et al. |
| 2004/0065100 A1 | 4/2004 | Jacobsen |
| 2004/0065104 A1 | 4/2004 | Bash et al. |
| 2004/0073597 A1 | 4/2004 | Caveney et al. |
| 2004/0075343 A1 | 4/2004 | Wareham et al. |
| 2004/0075984 A1 | 4/2004 | Bash et al. |
| 2004/0078708 A1 | 4/2004 | Li et al. |
| 2004/0083012 A1 | 4/2004 | Miller |
| 2004/0084967 A1 | 5/2004 | Nielsen |
| 2004/0089009 A1 | 5/2004 | Bash et al. |
| 2004/0089011 A1 | 5/2004 | Patel et al. |
| 2004/0098991 A1 | 5/2004 | Heyes |
| 2004/0099747 A1 | 5/2004 | Johnson et al. |
| 2004/0100770 A1 | 5/2004 | Chu et al. |
| 2004/0120855 A1 | 6/2004 | Reichel et al. |
| 2004/0155526 A1 | 8/2004 | Naden et al. |
| 2004/0163001 A1 | 8/2004 | Bodas |
| 2004/0186905 A1 | 9/2004 | Young et al. |
| 2004/0189161 A1 | 9/2004 | Davis et al. |
| 2004/0190247 A1 | 9/2004 | Chu et al. |
| 2004/0230848 A1 | 11/2004 | Mayo et al. |
| 2004/0240514 A1 | 12/2004 | Bash et al. |
| 2004/0262409 A1 | 12/2004 | Crippen et al. |
| 2005/0016189 A1 | 1/2005 | Wacker |

| | | |
|---|---|---|
| 2005/0023363 A1 | 2/2005 | Sharma et al. |
| 2005/0044882 A1 | 3/2005 | Hong et al. |
| 2005/0055590 A1 | 3/2005 | Farkas et al. |
| 2005/0061013 A1 | 3/2005 | Bond |
| 2005/0071699 A1 | 3/2005 | Hammond et al. |
| 2005/0108582 A1 | 5/2005 | Fung |
| 2005/0111669 A1 | 5/2005 | Park et al. |
| 2005/0114507 A1 | 5/2005 | Tarui et al. |
| 2005/0132729 A1 | 6/2005 | Manole |
| 2005/0170770 A1 | 8/2005 | Johnson et al. |
| 2005/0177755 A1 | 8/2005 | Fung |
| 2005/0185654 A1 | 8/2005 | Zadikian et al. |
| 2005/0198247 A1 | 9/2005 | Perry et al. |
| 2005/0207909 A1 | 9/2005 | Bean, Jr. et al. |
| 2005/0210905 A1 | 9/2005 | Burns et al. |
| 2005/0213306 A1 | 9/2005 | Vos et al. |
| 2005/0225936 A1 | 10/2005 | Day |
| 2005/0228618 A1 | 10/2005 | Patel et al. |
| 2005/0235671 A1 | 10/2005 | Belady et al. |
| 2005/0237715 A1 | 10/2005 | Staben et al. |
| 2005/0237716 A1 | 10/2005 | Chu et al. |
| 2005/0246431 A1 | 11/2005 | Spitaels |
| 2005/0247829 A1 | 11/2005 | Low et al. |
| 2005/0248922 A1 | 11/2005 | Chu et al. |
| 2005/0251802 A1 | 11/2005 | Bozek et al. |
| 2005/0267639 A1 | 12/2005 | Sharma et al. |
| 2005/0284169 A1* | 12/2005 | Tamura et al. ............... 62/324.1 |
| 2006/0002086 A1 | 1/2006 | Teneketges et al. |
| 2006/0025010 A1 | 2/2006 | Spitaels et al. |
| 2006/0042289 A1 | 3/2006 | Campbell et al. |
| 2006/0072262 A1 | 4/2006 | Paik et al. |
| 2006/0080001 A1 | 4/2006 | Bash et al. |
| 2006/0081545 A1 | 4/2006 | Rasmussen et al. |
| 2006/0082263 A1 | 4/2006 | Rimler et al. |
| 2006/0096306 A1 | 5/2006 | Okaza et al. |
| 2006/0102575 A1 | 5/2006 | Mattlin et al. |
| 2006/0108481 A1 | 5/2006 | Riedy et al. |
| 2006/0112286 A1 | 5/2006 | Whalley et al. |
| 2006/0115586 A1 | 6/2006 | Xing et al. |
| 2006/0121421 A1 | 6/2006 | Spitaels et al. |
| 2006/0126296 A1 | 6/2006 | Campbell et al. |
| 2006/0139877 A1 | 6/2006 | Germagian et al. |
| 2006/0144073 A1 | 7/2006 | Lee et al. |
| 2006/0162357 A1 | 7/2006 | Fink et al. |
| 2006/0168975 A1 | 8/2006 | Malone et al. |
| 2006/0203834 A1 | 9/2006 | Augustinus |
| 2006/0214014 A1 | 9/2006 | Bash et al. |
| 2006/0232945 A1 | 10/2006 | Chu et al. |
| 2006/0238941 A1 | 10/2006 | Ingemi et al. |
| 2006/0242288 A1 | 10/2006 | Masurkar |
| 2006/0250770 A1 | 11/2006 | Campbell et al. |
| 2006/0260338 A1 | 11/2006 | VanGilder et al. |
| 2006/0276121 A1 | 12/2006 | Rasmussen |
| 2007/0025271 A1 | 2/2007 | Niedrich et al. |
| 2007/0038414 A1 | 2/2007 | Rasmussen et al. |
| 2007/0072536 A1 | 3/2007 | Johnson et al. |
| 2007/0074537 A1 | 4/2007 | Bean et al. |
| 2007/0076373 A1 | 4/2007 | Fink |
| 2007/0078635 A1 | 4/2007 | Rasmussen et al. |
| 2007/0085678 A1 | 4/2007 | Joy et al. |
| 2007/0088822 A1 | 4/2007 | Coile et al. |
| 2007/0091569 A1 | 4/2007 | Campbell et al. |
| 2007/0091570 A1 | 4/2007 | Campbell et al. |
| 2007/0121295 A1 | 5/2007 | Campbell et al. |
| 2007/0129000 A1 | 6/2007 | Rasmussen et al. |
| 2007/0146994 A1 | 6/2007 | Germagian |
| 2007/0150215 A1 | 6/2007 | Spitaels et al. |
| 2007/0150584 A1 | 6/2007 | Srinivasan |
| 2007/0163748 A1 | 7/2007 | Rasmussen et al. |
| 2007/0165377 A1 | 7/2007 | Rasmussen et al. |
| 2007/0167125 A1 | 7/2007 | Rasmussen et al. |
| 2007/0171613 A1 | 7/2007 | McMahan et al. |
| 2007/0174024 A1 | 7/2007 | Rasmussen et al. |
| 2007/0187343 A1 | 8/2007 | Colucci et al. |
| 2007/0190919 A1 | 8/2007 | Donovan et al. |
| 2007/0213000 A1 | 9/2007 | Day |
| 2007/0271475 A1 | 11/2007 | Hatasaki et al. |
| 2007/0274035 A1 | 11/2007 | Fink et al. |
| 2008/0002364 A1 | 1/2008 | Campbell et al. |
| 2008/0004837 A1 | 1/2008 | Zwinger et al. |
| 2008/0041076 A1 | 2/2008 | Tutunoglu et al. |
| 2008/0041077 A1 | 2/2008 | Tutunoglu |
| 2008/0055852 A1 | 3/2008 | Uluc et al. |
| 2008/0104985 A1 | 5/2008 | Carlsen |
| 2008/0105412 A1 | 5/2008 | Carlsen et al. |
| 2008/0105753 A1 | 5/2008 | Carlsen et al. |
| 2008/0141703 A1 | 6/2008 | Bean, Jr. |
| 2008/0142068 A1 | 6/2008 | Bean et al. |
| 2008/0174954 A1 | 7/2008 | VanGilder et al. |
| 2008/0177424 A1 | 7/2008 | Wheeler |
| 2008/0180908 A1 | 7/2008 | Wexler |
| 2008/0198549 A1 | 8/2008 | Rasmussen et al. |
| 2008/0229318 A1 | 9/2008 | Franke |
| 2008/0245083 A1 | 10/2008 | Tutunoglu et al. |
| 2009/0007591 A1 | 1/2009 | Bean et al. |
| 2009/0019875 A1 | 1/2009 | Fink et al. |
| 2009/0030554 A1 | 1/2009 | Bean, Jr. et al. |
| 2009/0121547 A1 | 5/2009 | Paik et al. |
| 2009/0138313 A1 | 5/2009 | Morgan et al. |
| 2009/0138888 A1 | 5/2009 | Shah et al. |
| 2009/0150123 A1 | 6/2009 | Archibald et al. |
| 2009/0223234 A1 | 9/2009 | Campbell et al. |
| 2009/0259343 A1 | 10/2009 | Rasmussen et al. |
| 2009/0276771 A1 | 11/2009 | Nickolov et al. |
| 2010/0057263 A1 | 3/2010 | Tutunoglu |
| 2010/0170663 A1 | 7/2010 | Bean, Jr. |
| 2010/0211669 A1 | 8/2010 | Dalgas et al. |
| 2010/0211810 A1 | 8/2010 | Zacho |
| 2010/0286956 A1 | 11/2010 | VanGilder et al. |

FOREIGN PATENT DOCUMENTS

| | | |
|---|---|---|
| DE | 10 2006 041788 A1 | 3/2008 |
| EP | 0 602 911 A1 | 6/1994 |
| EP | 1610077 A2 | 12/2005 |
| EP | 1 672 300 A1 | 6/2006 |
| FR | 2 624 684 A1 | 6/1989 |
| FR | 2 864 854 A1 | 7/2005 |
| JP | 63-127042 A | 5/1988 |
| JP | 07-044275 A | 2/1995 |
| JP | 07 269926 | 10/1995 |
| JP | 09-298377 A | 11/1997 |
| JP | 2001-260640 A | 9/2001 |
| JP | 2002-101973 A | 4/2002 |
| JP | 2002-119339 A | 4/2002 |
| WO | 00/58673 | 10/2000 |
| WO | 02/065030 A1 | 8/2002 |
| WO | 2003005200 A1 | 1/2003 |
| WO | 03/083631 A1 | 10/2003 |
| WO | 03081406 A1 | 10/2003 |
| WO | 2005/081091 A2 | 9/2005 |
| WO | 2005/122664 A1 | 12/2005 |
| WO | 2006/034718 A1 | 4/2006 |
| WO | 2006119248 A2 | 11/2006 |
| WO | 2006124240 A2 | 11/2006 |
| WO | 2007095144 A2 | 8/2007 |
| WO | 2008144375 A2 | 11/2008 |
| WO | 2009/014893 A1 | 1/2009 |

OTHER PUBLICATIONS

Neil Rasmussen, "Avoidable Mistakes that Compromise Cooling Performance in Data Centers and Network Rooms," White Paper #49, Rev 2003-0, American Power Conversion, pp. 1-15.

Neil Rasmussen, "Cooling Options for Rack Equipment with Side-to-Side Airflow," White Paper #50, Rev 2004-0, American Power Conversion, pp. 1-14.

Neil Rasmussen, "Air Distribution Architecture Options for Mission Critical Facilities," White Paper #55, Revision 1, Rev 2003-0, American Power Conversion, pp. 1-13.

"How and Why Mission-Critical Cooling Systems Differ From Common Air Conditions," White Paper #56, Revision 2, Rev 2003-2, American Power Conversion, pp. 1-13.

Tony Evans, "Fundamental Principles of Air Conditioners for Information Technology," White Paper #57, Revision 1, Rev 2004-1, American Power Conversion, pp. 1-9.

Tony Evans, "Humidification Strategies for Data Centers and Network Rooms," White Paper #58, Rev 2004-0, American Power Conversion, pp. 1-13.

Tony Evans, "The Different Types of Air Conditioning Equipment for IT Environments," White Paper #59, Rev 2004-0, American Power Conversion, pp. 1-21.
Neil Rasmussen, "Guidelines for Specification of Data Center Power Density," White Paper #120, Rev 2005-0, American Power Conversion, pp. 1-21.
Althouse, Turnquist, Bracciano: "Modern Refrigeration and Air Conditioning," 2000, The Goodheart-Willcox Company, Inc., XP002479591, pp. 715-716.
"Enthalpy" Published by the National Aeronautics and Space Administration and edited by Tom Benson. Retrieved on Jul. 13, 2009 from http://www.grc.nasa.gov/WWW/K-12/airplane/enthalpy. html, pp. 3.
Rittal Catalogue, Aug. 2005, p. 115 and p. 140.
International Search Report for PCT/US2006/037772 mailed Jul. 10, 2007.
International Search Report for PCT/US07/01109 mailed Mar. 28, 2008.
International Search Report for PCT/US2007/087928 mailed Jul. 29, 2008.
International Search Report for PCT/US2007/087910 mailed Apr. 15, 2009.
International Search Report for PCT/US2009/043400 mailed Nov. 23, 2009.
"Management Strategy for Network Critical Physical Infrastructure", White Paper #100, pp. 110, American Power Conversion, Dec. 15, 2003, published on World Wide Web.
Abdlmonem H. Beitelmal et al.: "Thermo-Fluids Provisioning of a High Performance High Density Data Center" Distributed and Parallel Databases, Kluwer Academic Publishers, BO, vol. 21, No. 2-3, Apr. 22, 2006, pp. 227-238, XP019499843, ISSN: 1573-7578.
Abi-Zadeh, Davar et al., "A Transient Analysis of Environmental Conditions for a Mission Critical Facility after a Failure of Power", Arup Mission Criticial Facilities, Feb. 2001, pp. 1-12.
Ahmad, Jasim U. et al., "Navier-Stokes simulation of air-conditioning facility of a large modern computer room," Jun. 2005, Proceedings of the 2005 ASME Fluids Engineering Division Summer Meeting and Exhibition, pp. 1-6.
APC User's Guide Brochure, "InfraStruXure Manager," Mar. 2004, 181 pgs.
ASHRAE, "Thermal Guidelines for Data Processing Environments" 2004, Atlanta: American Society of Heating, Refrigerating, and Air-Conditioning Engineers, Inc., 2004, Atlanta.
Bash, C. E. et al.: "Balance of Power: Dynamic Thermal Management for Internet Data Centers", IEEE Internet Computing , Jan. 1, 2005, pp. 42-49, vol. 9, No. 1, IEEE Service Center, New York, NY.
Bash, C.E., Patel, C.D., and Sharma, R.K., "Efficient Thermal Management of Data Centers—Immediate and Long-Term Research Needs" Intl. J. Heat, Ventilating, Air-Conditioning and Refrigeration Research, 2003, pp. 137-152, vol. 9, No. 2.
Beitelmal et al., "Thermo-Fluids Provisioning of a High Performance High Density Data Center", Apr. 22, 2006, Springer Science and Business Media, Inc, Distributed and Parallel Databases, 21, pp. 227-238 DOI:1 0.1 007/s1 0619-005-0413-0.
Chandrakant D. Patel, et al., "Thermal Considerations in Cooling Large Scale High Copute Density Data Centers" IEEE 2002, pp. 767-776.
Dvinsky: "Hot Tips for Using Cooling Software a Little Planning Lets Users Get More from Their Thermal-Simulation Software", Machine Design, Penton Media, Cleveland, OH, vol. 72, No. 4, Feb. 24, 2000.
Ehsan Pakabaznia et al., "Miminizing data center cooling and server power costs", Proceedings of the 14TH ACM/IEEE International Symposium on Low Power Electronics and Design, ISLPED '09, Jan. 1, 2009, p. 145, XP55015368, New York, New York, USA, DOI: 10.1145/1594233.1594268, ISBN: 978-1-60-558684-7.
Herrlin, M.K., "Rack Cooling Effectiveness in Data Centers and Telecom Central Offices: The Rack Cooling Index (RCI)," ASHRAE Transaction, 2005, pp. 725-731, vol. 111(2).
Innovative Research, Inc., http://web.archive.org/web/20051221005029/http://www.inres.com/, Dec. 21, 2005, published on World Wide Web.
International Search Report and Written Opinion from corresponding International Application No. PCT/2010/022074, dated Jul. 27, 2010.
International Search Report and Written Opinion from corresponding International Application No. PCT/US2011/052561, dated Dec. 27, 2011.
International Search Report for PCT/US2006/16739 mailed Oct. 3, 2006.
International Search Report for PCT/US2008/051908 mailed Jul. 3, 2008.
International Search Report for PCT/US2009/065700 mailed Feb. 18, 2010.
International Search Report for PCT/US2010/023142, mailed May 11, 2010.
International Search Report for PCT/US2010/033867 mailed Jul. 7, 2010.
International Search Report for PCT/US2010/033876 mailed Jul. 1, 2010.
International Search Report for PCT/US2010/035089 mailed Jul. 26, 2010.
International Search Report for PCT/US2011/051866 mailed Feb. 24, 2012.
International Search Report for PCT/US2011/067332 mailed Jun. 8, 2012.
Jeffrey Rambo et al., "Modeling of data center airflow and heat transfer: State of the art and future trends", Distributed and Parallel Databases, Kluwer Academic Publishers, BO, vol. 21, No. 2-3, Jan. 20, 2007, pp. 193-225, XP019499845, ISSN: 1573-7578, DOI:10. 1007/S10619-006-7007-3.
K. Dunlap, "Cooling Audit for Identifying Potential Cooling Problems in Data Centers", White Paper #40, pp. 1-18, American Power Conversion, May 20, 2004, published on World Wide Web.
Le et al., "Operating Behaviour of Single Split Coil Systems Under Modulating and Two-Position Control", Published by 2005 by American Society of Heating, Refrigerating and Air-Conditioning Engineers, Inc.
Modern Refrigeration and Air Conditioning (18th Edition) Althouse et al. Published by the Goodheart-Willcox Company, Inc. (c)2000.
N. Rasmussen, "Calculating Total Cooling Requirements for Data Centers", White Paper #25, pp. 1-8, American Power Conversion, May 20, 2004, published on World Wide Web.
N. Rasmussen, "Cooling Strategies for Ultra-High Density Racks and Blade Servers", White Paper #46, pp. 1-22, American Power Conversion, Mar. 29, 2005, published on World Wide Web.
N. Rasmussen, "Strategies for Deploying Blade Servers in Existing Data Centers", White Paper #125, pp. 1-14, American Power Conversion, Mar. 29, 2005, published on World Wide Web.
Pinheiro, Eduardo, "Load Balancing and Unbalancing for Power and Performance in Cluster-Based Systems," Internet Citation, May 1, 2001 URL:http://research.ac.upc.es/pact01/colp/paper04.pdf, retrieved on Nov. 17, 2003.
Rittal, <http://www.rittal.com/services_support/downloads/brochures.asp>, download page for catalogue 31.
Rittal, Catalogue 31, front page p. 672 and back page, Apr. 2005.
Sharma, R.K, Bash, C.E, and Patel, C.D, "Dimensionless Parameters for Evaluation of Thermal Design and Performance of Large-Scale Data Centers." 8th ASME/AIAA Joint Thermophysics and Heat Transfer Conference, Jun. 24-26, 2002. St. Louis, Missouri.
Shrivastava S K et al., Optimization of Cluster Cooling Performance for Data Centers, Thermal and Thermomechanical Phenomena in Electronic Systems, May 28, 2008, pp. 1161-1166, 11th Intersociety Conference on, IEEE, Piscataway, NJ.
Thermodynamics: An Engineering Approach (Fourth Edition) Cengel et al. Published by McGraw Hill (c)2004.
Vangilder et al., "Airflow Uniformity thourhg Perforated Tiles in a Raised-Floor Data Center", White Paper 121, Jul. 17-22, 2005, 10 pages.
Vangilder, James W. et al., "Caputure index: an airflow-based rack cooling performance metric," 2007, ASHRAE Transactions, vol. 113, pp. 126-136.
Vangilder, James W. et al., "Real-Time prediction of rack-cooling performance," 2006, ASHRAE Transactions, vol. 112, pp. 151-162.

* cited by examiner

MODULAR ICE STORAGE FOR UNINTERRUPTIBLE CHILLED WATER

RELATED APPLICATIONS

This application is a Continuation of U.S. patent application Ser. No. 11/640,650, filed Dec. 18, 2006, which is hereby incorporated herein by reference.

BACKGROUND OF INVENTION

1. Field of Invention

Embodiments of the invention relate generally to a backup cooling system. Specifically, aspects of the invention relate to a modular and scalable backup cooling storage system that may cool a liquid supply when a main liquid chiller of that liquid supply is not operational.

2. Discussion of Related Art

Heat produced by electronic equipment, such as servers and blade servers, can have adverse effects on the performance, reliability and useful life of the electronic equipment. As electronic equipment becomes faster, smaller, and more power consuming, such electronic equipment also produces more heat, making control of heat more critical to reliable operation of the electronic equipment.

A typical environment where heat control may be critical includes a data center containing racks of electronic equipment. As the size of electronic equipment has decreased, the amount of electronic equipment in each rack and heat generated by the electronic equipment in the racks has increased. Furthermore, as demand for processing power has increased, data centers have increased in size so that a typical data center may now contain hundreds of such racks.

An exemplary industry standard rack used to store such electronic equipment is approximately six to six-and-a-half feet high, by about twenty-four inches wide, and about forty inches deep. Such a rack is commonly referred to as a "nineteen inch" rack, as defined by the Electronics Industries Association's EIA-310-D standard.

To address heat-related issues of the electronic equipment stored in these racks, computer room air conditioner (CRAC) units may be disposed in various arrangements within data centers to cool or assist in cooling air supplied to the racks. These CRACs generally intake warm air from one side of the CRAC unit from one direction and output cooled air out of another side of the CRAC unit in another direction. The racks may direct the cooled air using one or more fans to cool the electronic equipment stored in the racks.

In particularly heat-dense data centers, chilled liquids have been supplied to CRAC units for use in generating a cool air supply to the electronic equipment racks. In these liquid-based cooling systems, a main liquid chiller may supply CRAC units in a data center with a flow of a chilled liquid. A piping system may be disposed in the data center to pipe the chilled liquid from the main liquid chiller to the CRAC units for use in cooling the electronic equipment and to pipe warm liquid back from the racks to the main liquid chiller to be cooled again. For example, in some arrangements, liquid may be pumped through overhead piping to the CRAC units. In the CRAC units, the liquid may be used by a heat exchanger to cool air that is then supplied to cool the electronic equipment in the electronic equipment racks.

Because heat dense data centers such as those that typically warrant liquid-based cooling systems may not tolerate cooling loss for extended periods of time, the main liquid chiller of such liquid-based chilling systems generally is connected to backup power generators that may power the main liquid chiller if a main power supply to the main liquid chiller fails. Such backup power supplies may need to produce a relatively large amount of power to supply the main liquid chiller with the power needed to chill the liquid supply.

SUMMARY OF INVENTION

One aspect of the invention includes a backup cooling storage system. Some embodiments include at least one cooling and storage unit configured to cool a liquid supply using a quantity of cooled material when a main chiller of the liquid supply is not operational, and at least one chilling element configured to generate the quantity of cooled material for the at least one cooling and storage unit when the main chiller of the liquid supply is operational.

In some embodiments, the liquid supply includes at least one of a composition comprising water and a composition comprising glycol. Some embodiments include at least one sensor configured to monitor a parameter of the liquid supply. In some embodiments, the at least one sensor includes at least one temperature sensor configured to monitor a temperature of the liquid supply. In some embodiments, the at least one cooling and storage unit is configured to cool the liquid supply when the temperature is greater than a threshold value. In some embodiments, the threshold value is about forty-eight degrees Fahrenheit. In some embodiments, the at least one sensor includes at least one pressure sensor configured to monitor a pressure of the liquid supply. In some embodiments, the at least one cooling and storage unit is configured to cool the liquid supply when the pressure is less than a threshold value.

In some embodiments, the at least one cooling and storage unit includes at least one cooled material storage tank configured to store the quantity of cooled material. In some embodiments, the quantity of cooled material includes a quantity of a first portion of the cooled material and a quantity of a second portion of the cooled material, the first portion being a liquid portion of the cooled material, and the second portion being a solid portion of the cooled material. In some embodiments, the first portion includes water and the second portion includes ice. In some embodiments, the at least one cooled material storage tank includes a plurality of cooled material storage tanks. In some embodiments, each cooled material storage tank of the at least one cooled material storage tank is configured to store an amount of cooled material capable of cooling the liquid supply by between about ten and about fifty kilowatts for between about fifteen and thirty minutes.

In some embodiments, the at least one cooling and storage unit includes at least one liquid transfer element configured to direct at least a portion of the liquid supply through the at least one cooled material storage tank so that heat transfers between at least the portion of the liquid supply and the quantity of cooled material. In some embodiments, the at least one liquid transfer element includes at least one copper pipe. In some embodiments, the at least one copper pipe includes a plurality of heat transfer fins configured to transfer heat between at least the portion of the liquid supply and the quantity of cooled material. In some embodiments, the at least one chilling element includes at least one thermoelectric chiller. In some embodiments, the at least one chilling element is configured to generate and maintain the quantity of cooled material by operating the at least one thermoelectric chiller to cool the portion of the liquid supply and directing the portion of the liquid supply to the at least one liquid transfer element for direction through the at least one cooling and storage unit. In some embodiments, the at least one thermoelectric chiller is configured to cool the portion of the liquid supply to below a freezing temperature of water present in the at least one cooling and storage unit.

In some embodiments, the at least one chilling element is configured to generate and maintain the quantity of cooled material so that at least a predetermined amount of the quantity of cooled material is frozen. In some embodiments, the at least one predetermined amount includes a predetermined ratio such that about ninety percent of the cooled material is frozen. In some embodiments, the chilling element includes a cooled material monitoring element configured to monitor a current amount of the quantity of cooled material that is frozen. In some embodiments, the cooled material monitoring element includes an aeration device submerged into the quantity of cooled material from above and configured to release a gas bubble into the quantity of cooled material, and wherein the cooled material monitoring element is configured to determine the current amount based on a pressure used to release the gas bubble into the quantity of cooled material.

In some embodiments, the backup cooling system further comprises a standard rack housing configured to store the at least one chilling element and the at least one cooling and storage unit. In some embodiments, the backup cooling storage system further comprises first and second liquid connection elements through which the liquid supply is provided to and exhausted from the backup cooling storage system, wherein the first and second liquid connection elements are standard liquid connection elements of a liquid-based cooling system. In some embodiments, the backup cooling storage system is configured to scale at least one of a cooling amount and a cooling time with other backup cooling storage systems.

One aspect of the invention includes a cooling system. Some embodiments include a main chilling unit configured to cool a liquid supply, and at least one backup cooling unit configured to generate and maintain a quantity of cooled material using the liquid supply when the main chilling unit is operational and configured to cool the liquid supply using the quantity of cooled material when the main chilling element is not operational.

In some embodiments, the liquid supply includes at least one of a composition comprising water and a composition comprising glycol. In some embodiments, the at least one backup cooling unit is configured to generate and maintain the quantity of cooled material when a temperature of the liquid supply is below a threshold value, and wherein the at least one backup cooling unit is configured to cool the liquid supply when the temperature of the liquid supply is above the threshold value. In some embodiments, the at least one backup cooling unit includes at least one storage tank configured to store the quantity of cooled material. In some embodiments, the quantity of cooled material includes a quantity of a first portion of the cooled material and a quantity of a second portion of the cooled material, the first portion being a liquid portion of the cooled material, and the second portion being a solid portion of the cooled material. In some embodiments, the first portion includes water and the second portion includes ice.

In some embodiments, the at least one backup cooling unit includes at least one chiller configured to further cool at least a portion of the liquid supply to generate and maintain the quantity of cooled material when the main chilling element is operational. In some embodiments, the at least one chiller includes at least one thermoelectric chiller. In some embodiments, the at least one backup cooling unit includes at least one liquid directing element configured to direct at least a portion of the liquid supply through the at least one backup cooling unit so that heat transfers between at least the portion of the liquid supply and the quantity of cooled material.

In some embodiments, the main chilling element and backup cooling unit are further configured to provide the liquid supply to a cooling system. In some embodiments, the at least one backup cooling unit is housed in at least one standard rack. In some embodiments, each backup cooling unit of the at least one cooling unit is configured to generate a cooling output over a cooling period. In some embodiments, the at least one backup cooling unit includes a desired number of ice storage elements corresponding to a total desired cooling output and a total desired cooling period.

One aspect of the invention includes a method of supplying emergency cooling. In some embodiments, the method includes maintaining a quantity of stored cooled material using a liquid supply from a main chiller when the main chiller is operational, and cooling the liquid supply using the quantity of stored cooled material when the main chiller is not operational.

In some embodiments, the liquid supply includes at least one of a composition comprising water and a composition comprising glycol. In some embodiments, maintaining a quantity of stored cooled material using a liquid supply from a main chiller when the main chiller is operational includes freezing at least a first portion of the quantity of cooled material, and subsequently cooling the quantity of cooled material such that the first portion remains in a frozen state. In some embodiments, the frozen first portion includes ice and an unfrozen second portion of the quantity of cooled material includes water. In some embodiments, maintaining a quantity of stored cooled material using a liquid supply from a main chiller when the main chiller is operational includes maintaining the quantity of cooled material in a cooled material storage unit housed in a standard rack.

In some embodiments, maintaining a quantity of stored cooled material using a liquid supply from a main chiller when the main chiller is operational includes monitoring at least one parameter of the quantity of stored cooled material. In some embodiments, monitoring at least one parameter of the quantity of stored cooled material includes monitoring a pressure exerted to release at least one bubble into the quantity of stored cooled material. In some embodiments, maintaining a quantity of stored cooled material using a liquid supply from a main chiller when the main chiller is operational includes cooling a portion of the liquid supply and directing the portion of the liquid supply through the cooled material storage unit such that heat transfers between the quantity of cooled material and the liquid supply. In some embodiments, maintaining a quantity of stored cooled material using a liquid supply from a main chiller when the main chiller is operational includes thermoelectrically cooling the portion of the liquid supply.

In some embodiments, cooling the liquid supply using the quantity of stored cooled material when the main chiller is not operational includes directing a portion of the liquid supply through the cooled material storage unit such that heat transfers between the quantity of cooled material and the liquid supply. Some embodiments include monitoring the liquid supply to determine if the main chiller is operational. In some embodiments, monitoring the liquid supply to determine if the main chiller is operational includes monitoring at least one of a temperature of the liquid supply and a pressure of the liquid supply. Some embodiments further include providing the liquid supply to at least one piece of cooling equipment.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
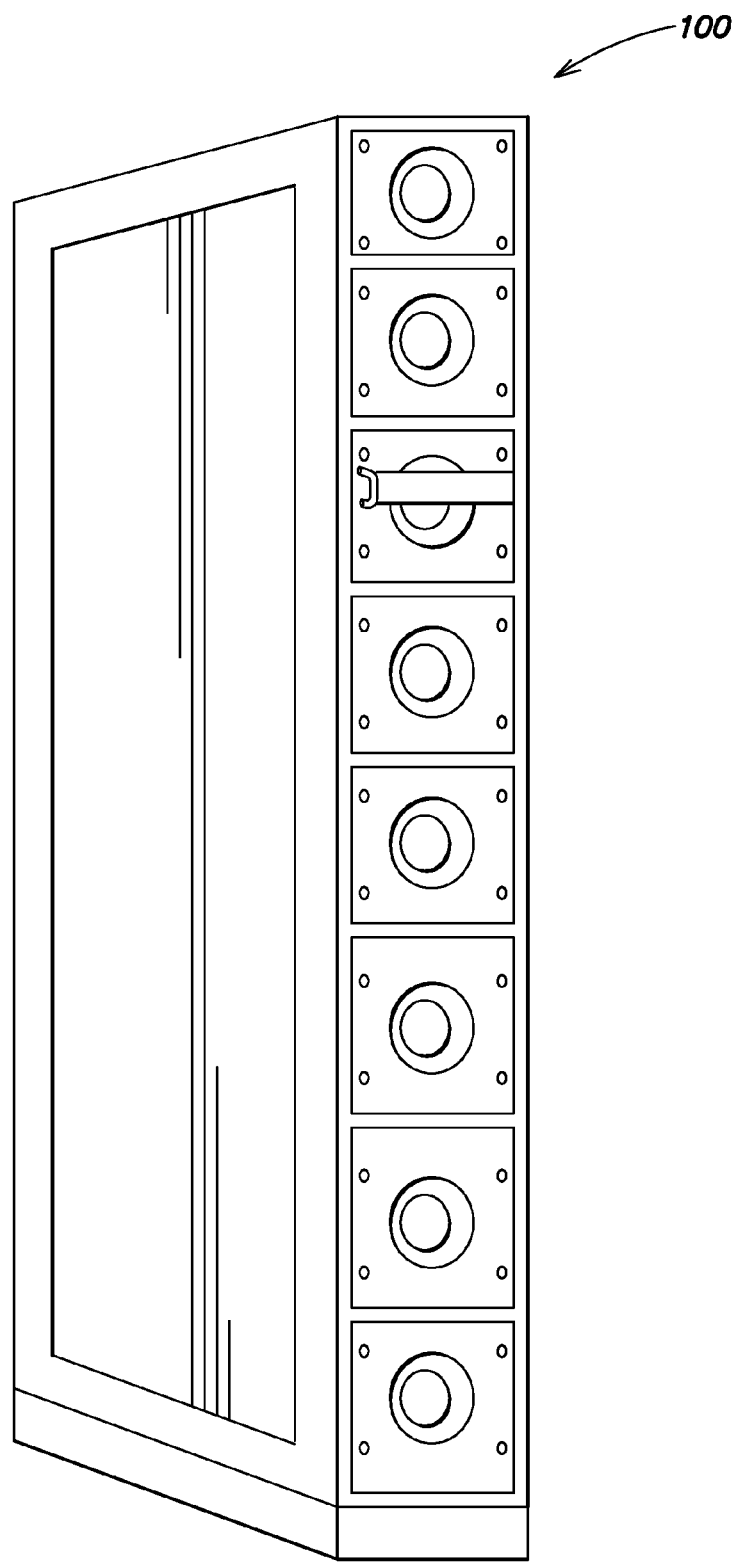
FIG. 1 is a perspective view of a cooling unit of an embodiment of the invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

In accordance with one aspect of the invention, it is recognized that traditional liquid-based cooling systems may not have sufficient emergency protection from failures of main liquid chillers. As described above, in a traditional liquid-based cooling system, protection from failure of the main liquid chiller may include a backup power generator used when a main power supply to the main liquid chiller fails.

Because of delays associated with such a backup power generator, it may be incapable of preventing damage or failure from heat in a modern heat-dense data center. For example, in such data centers, a thermal failure may occur in less than about two minutes after the main liquid chiller fails. However, backup generators may require about five to seven minutes before returning the main liquid chiller to operation after a failure of the main power supply. Moreover, the main liquid chiller may fail for a number of reasons other than power failures (e.g., mechanical failures), and/or require repair or maintenance that require the main liquid chiller to be shut down. Backup power generators provide no emergency protection in these later situations.

In general, at least one embodiment of the invention is directed at providing emergency backup cooling for a liquid-based cooling system. Specifically, at least one embodiment of the invention is directed at a backup cooling storage system configured to generate and maintain a quantity of ice using a flow of chilled liquid when the main liquid chiller of the liquid-based cooling system is operational and to chill the flow of liquid and supply it to cooling units (e.g., CRAC units) when the main liquid chiller is not operational.

Although the invention is described in terms of a liquid-based cooling system in which a liquid flow is provided through pipes to cooling units (e.g., CRAC units), it should be understood to include any cooling system in which emergency backup cooling may be desired. Particularly, embodiments of the invention may include any liquid-based cooling systems, including liquid-based cooling systems that supply a composition comprising water, and/or a composition comprising glycol. Moreover, embodiments of the invention may include cooling systems in which the liquid is provided to the cooling units through any means, including pipes, or any other liquid directing device. Also, it should be understood that embodiments of the invention are not limited to cooling systems used to cool electronic equipment or racks filled with electronic equipment but may be used to cool any object and/or space.

FIG. 1 illustrates a cooling unit 100 that may be used with a liquid-based cooling system. The cooling unit 100 may intake a supply of chilled liquid from the cooling system through an inlet/outlet connection. The cooling unit 100 may direct the chilled liquid to one or more heat exchangers that may use the chilled liquid to cool a flow of air and/or other fluid and exhaust a heated liquid. The cooled flow of air and/or other fluid may be supplied to one or more electronic equipment racks to cool electronic equipment housed in the one or more electronic equipment racks. The cooling unit 100 may then direct the heated liquid from the cooling unit 100 to a liquid inlet/outlet to be exhausted back to the cooling system. Example of cooling units in accordance with some embodiment of the invention are described in more detail in U.S. patent application Ser. Nos. 11/335,874 filed Jan. 19, 2006 and entitled "COOLING SYSTEM AND METHOD, 11/504,382 filed Aug. 15, 2006 entitled "METHOD AND APPARATUS FOR COOLING," and 11/504,370 filed Aug. 15, 2006 entitled "METHOD AND APPARATUS FOR COOLING," which are hereby incorporated herein by reference.

In some implementations of the invention, cooling units may include one or more of InRow RP Chilled Water Systems available from APC, Corp., West Kingston, R.I., Network AIR IR 20 KW Chilled Water Systems available from APC, Corp., West Kingston, R.I., FM CRAC Series Systems available from APC, Corp., West Kingston, R.I., and/or any other precision cooling equipment.

In at least one embodiment of the invention, the cooling system may be configured to cool a plurality of electronic equipment racks disposed in one or more data center rooms. The cooling system may include a plurality of inlet/outlet connections disposed in the data center room to which cooling units may be connected so that the liquid supply may be directed to the cooling units so as to cool the electronic equipment housed in the electronic equipment racks.

Figure 2:
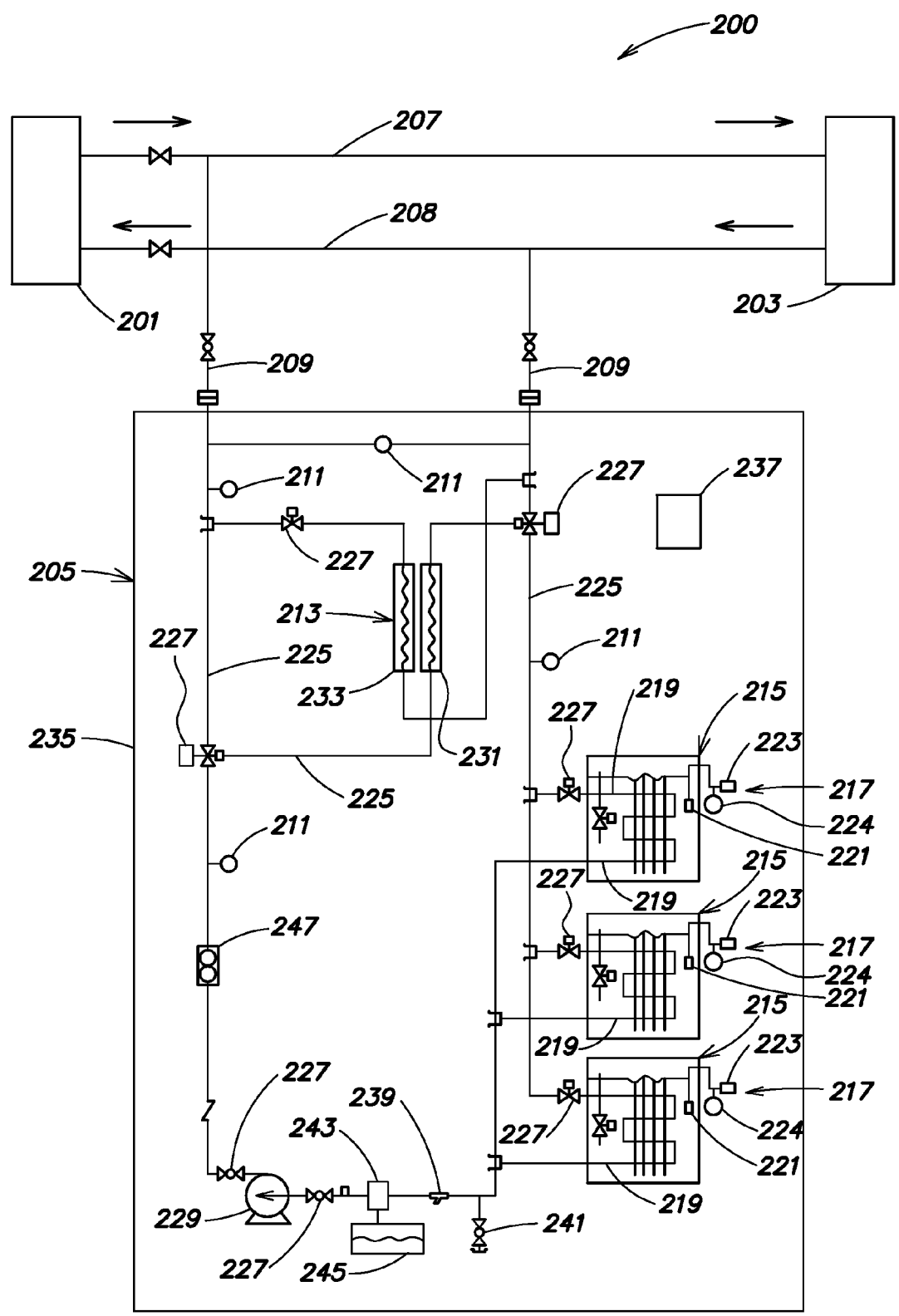
FIG. 2 is a schematic diagram of a portion of a cooling system in accordance with an embodiment of the invention.

FIG. 2 illustrates a schematic view of a portion of a cooling system 200 in accordance with at least one embodiment of the invention. As described above, the cooling system 200 may include at least one main liquid chiller 201 configured to chill the liquid supplied to one or more cooling units 203. The main liquid chiller 201 may intake warm liquid that was exhausted by the cooling units 203, cool the warmed liquid, and supply the now cooled liquid back to the cooling units 203. The main liquid chiller 201 may be configured to supply liquid to the cooling units 203 at a temperature and volume sufficient to maintain a desired temperature of the electronic equipment housed in the cooling units 203. In one implementation, the main liquid chiller 201 may supply liquid at a temperature of about 45 degrees Fahrenheit. In one implementation, the main liquid chiller 201 may supply a volume of chilled liquid that is at least as great as the combined volume of liquid taken in by the cooled cooling units 203 and a backup cooling storage system.

The main liquid chiller 201 may be powered by one or more main liquid chiller power supplies (not shown). The one or more main liquid chiller power supplies may include utility power of a building in which the main liquid chiller is disposed, an uninterruptible power supply, and/or any other power supply.

In at least one embodiment of the invention, the cooling system 200 may include one or more pipes 207, 208. The pipes 207, 208 may be configured to couple the components of the cooling system 200 so that liquid may flow among/ between the components. In one embodiment, the pipes 207, 208 may be configured to direct cooled liquid from the main liquid chiller 201 to the cooling units 203 cooled by the cooling system 200. The pipes 207, 208 may also be configured to direct warmed liquid back from the cooling units 203 to the main liquid chiller 201. Specifically, as shown, one pipe 207 may be configured to direct cooled liquid from the main liquid chiller 201 to the cooling unit 203 and another pipe 208 may be configured to direct warmed liquid from the cooling unit to the main liquid chiller 201.

In at least one embodiment of the invention, the cooling system 200 may include at least one backup cooling storage system 205. The backup cooling storage system 205 may be coupled to the cooling system 200 through the one or more pipes 207, 208 as illustrated in FIG. 2. The pipes 207, 208 and backup cooling storage system 205 may connect to one another in fluid communication using one or more inlet/outlet connections 209 so that the liquid may flow between the backup cooling storage system 205, the rest of the liquid-based cooling system 200 and the cooling units 203. In one embodiment, the inlet/outlet connections 209 may be standard connections (e.g., industry standard connection types such as those used to couple CRAC units to a liquid supply). In such an embodiment, the backup cooling storage system may connect to the pipes 207, 208 using inlet/outlet connections 209 disposed in a data center room, as described above.

The backup cooling storage system 205 may include one or more sensors 211. The sensors 211 may be configured to monitor parameters of the liquid being supplied to and/or from the backup cooling storage system 205 (e.g., to/from the main liquid chiller 201 and to/from the cooling units 203). The sensors 211 may include temperature and/or pressure sensors. The backup cooling storage system 205 may be configured so that when the sensors 211 measure a failure condition indicating a failure of the main liquid chiller 201, the backup cooling storage system 205 begins to chill the liquid and supply the liquid to the cooling units 203, as described in more detail below. The failure condition may include a high temperature of the liquid and/or a low pressure of the liquid. In one implementation, the failure condition may include a temperature of liquid output by the main liquid chiller 201 that is above about forty-eight degrees Fahrenheit.

In some embodiments, the backup cooling storage system 205 may be configured to chill and supply the liquid until an external signal is received (e.g., from a remote chiller monitor as discussed below, from the mail liquid chiller, from a cooling control system, etc.). Such embodiments that rely on an external signal to identify when the main liquid chiller 201 has returned to an operational state may provide a pressure of the liquid and temperature of the liquid to the cooling units 203 that is within the normal operating range experienced when the main liquid chiller 201 is operational.

In other embodiments, the backup cooling storage system 205 may provide a lower temperature and/or pressure of liquid than during normal operation of the main liquid chiller 201. In such embodiments, the sensors 211 may continue to monitor the liquid for an operational condition indicating that the main liquid chiller 201 is operational. When the sensors 211 measure the operational condition (e.g., a temperature and/or pressure of the liquid indicative of a properly functioning main liquid chiller 201), the backup cooling storage system 205 may be configured to stop chilling the liquid and maintain and/or generate ice, as described in more detail below.

To facilitate generation and maintenance of ice, the backup cooling storage system 205 may include at least one liquid cooler (e.g., 213). In one embodiment, the liquid cooler (e.g., 213) may be part of one or more cooling storage tanks 215, described below. In such an implementation, the liquid cooler (e.g., 213) may be configured to directly cool ice and/or water stored in the cooling storage tanks 215.

In another embodiment, as illustrated in FIG. 2, the liquid cooler (e.g., 213) may be configured to cool liquid supplied from the main liquid chiller 201 and to supply that cooled liquid to the cooling storage tanks 215 in order to generate and maintain ice. In one embodiment, the liquid cooler (e.g., 213) may include a thermoelectric chiller 213, which may include a cold side 231 configured to cool liquid and a warm side 233 configured to warm liquid (e.g., using the energy transferred from the cool side and heat from electric energy consumed). The thermoelectric chiller 213 may be configured to reduce a temperature of the liquid to a level sufficient to freeze water in the cooling storage tanks 215. In such an embodiment, as illustrated in FIG. 2, a first portion of the liquid supplied to the backup cooling storage system 205 may be directed along the warm side 233 of the thermoelectric chiller 213 to be warmed by the thermoelectric chiller 213 and exhausted by the backup cooling storage system 205 back to the main liquid chiller 201. In one implementation, the temperature of the liquid exhausted to the main liquid chiller 201 may be about 48 degrees Fahrenheit. A second portion of the liquid may be directed along the cold side 231 of the thermoelectric chiller 213 to be cooled by the thermoelectric chiller to a temperature sufficient to freeze water in the cooling storage tanks 215, and then the second portion of the liquid may be directed to the cooling storage tanks 215 to generate and/or maintain the ice in the cooling storage tanks 215. In some implementations, the second portion of the liquid may then be exhausted back to the main liquid chiller 201. In other implementations, the liquid may be directed back to the cold side 231 of the thermoelectric chiller 213 for use in generating and maintaining more ice. In one implementation, the temperature of the liquid supplied to the cooling storage tanks 215 may be about 27 degrees Fahrenheit. In one implementation, the thermoelectric chiller 213 may include a direct thermoelectric chiller such as the one disclosed in U.S. patent application Ser. No. 11/640,652 to Bean, et al., filed concurrently with the instant application, and entitled "DIRECT THERMOELECTRIC CHILLER ASSEMBLY," which is hereby incorporated herein by reference.

As discussed above, embodiments of the backup cooling storage system 205 may include one or more cooling storage tanks, each indicated at 215. The cooling storage tanks 215 may be configured to store a quantity of ice that may be used to chill the liquid supplied to the cooling units 203 and/or a quantity of water that may be frozen to create the quantity of ice and be used to monitor the quantity of ice. In some implementations, the quantities of ice and water may include a desired volume of ice and/or water and/or a desired weight of ice and/or water. The quantity of ice may be large enough to supply a desired total cooling output. The total cooling output of the quantity of ice may correspond to the total heat required to melt the quantity of ice (e.g., 152 kilojoules per pound of ice). The quantity of water may be large enough to cover the quantity of ice and allow at least a portion of an ice monitor 217 to be disposed within the quantity of water as described in more detail below. In one implementation, the backup cooling storage system 205 may include three cooling storage tanks 215. In one implementation, each cooling storage tank 215 may be large enough to store about 28 gallons of water. In one implementation, each cooling storage tank 215 may be approximately thirty-four inches by approximately twenty inches by approximately nineteen inches in size.

It should be understood that while the illustrated embodiment includes a cooling storage tank 215 used to store quantities of ice and/or water, embodiments of the invention are not limited to such cooling storage tanks. Rather, embodiments of the invention may include storage tanks configured to store any composition, including liquids, gases, and/or solids. Moreover, while the illustrated embodiment of the invention utilizes a state change from solid to liquid to store thermal energy, other embodiments of the invention may utilize a solid to gas and/or liquid to gas state change, or no state change at all to store thermal energy.

To facilitate transfer of heat between the quantities of ice and/or water (or any other substance) stored in the cooling storage tank 215 and the liquid supplied to the cooling storage tank 215 in order to maintain and generate the ice when the main liquid chiller 201 is operational and/or to cool the liquid before it is provided to the cooling units 203 when the main liquid chiller 201 is not operational, a thermally conductive pipe 219 may direct the liquid through the cooling storage tank 215. In one embodiment, the thermally conductive pipe 219 may be designed to maximize heat exchange between the quantities of ice and water and the liquid. In at least one implementation, the thermally conductive pipe 219 may include a copper pipe and/or a pipe made from any other thermally conductive material. In one implementation the thermally conductive pipe 219 may include one or more fins or other protrusions configured to increase the surface area of the thermally conductive pipe 219 and thereby increase the heat exchanged between the liquid carried by the thermally conductive pipe 219 and the quantities of ice and water stored in the cooling storage tank 215. In one implementation, as illustrated in FIG. 2, the thermally conductive pipe 219 may be arranged to direct the liquid through the cooling storage tank 215 in an indirect path to increase the time during which heat may be exchanged between the quantities of ice and water and the liquid.

Although embodiments of the cooling storage tank 215 have been described in which the thermally conductive pipe 219 is designed to maximize heat exchange between the liquid and quantities of ice and water, other embodiments may limit the heat transfer by using non-conductive materials, limiting surface area of pipes, and/or minimizing a path through the cooling storage tank 215. A set of characteristics may be chosen for the thermally conductive pipe 219 that produce a desired heat exchange rate such that a cooling output (i.e., amount by which the liquid is cooled) and cooling time (i.e., amount of time the cooling output is maintained) may be generated by the cooling storage tank 215. Increasing heat exchange rates may increase the cooling output but decrease the cooling time. Likewise, decreasing the heat transfer rate may increase the cooling time but decrease the cooling output. In some implementations, the thermally conductive pipe 219 and each cooling storage tank 215 may be configured such that each cooling storage tank 215 may generate between about ten and about fifty kilowatts of cooling output for between about fifteen and about thirty minutes of cooling time. In one implementation, the thermally conductive pipe 219 and each cooling storage tank 215 may be configured such that each cooling storage tank 215 may generate approximately twenty-five kilowatts of cooling output for approximately seventeen minutes of cooling time.

Figure 3:
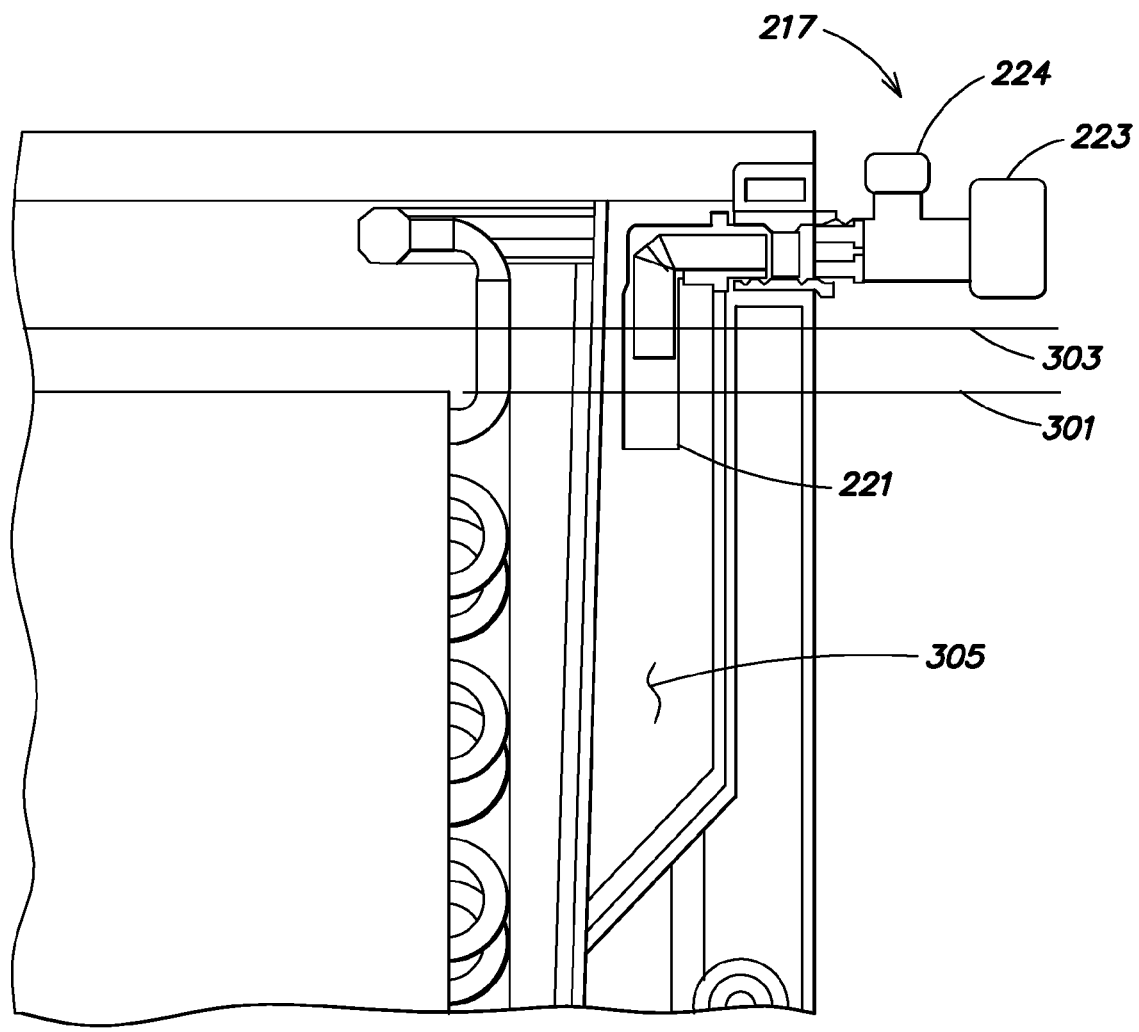
FIG. 3 is a schematic diagram of an ice monitor that may be used in some embodiments of the invention.

In one embodiment of the invention, the cooling storage tank 215 may include an ice monitor 217. In one embodiment, the ice monitor 217 may be configured to monitor a ratio of the quantity of ice to the quantity of water currently stored in the cooling storage tank 215. One embodiment of an ice monitor 217 in accordance with the invention is illustrated in FIG. 3. In one embodiment, the ice monitor 217 may include an aeration device 221 such as a glass, rubber, metal, and/or plastic air tube. In one implementation, the ice monitor 217 may include an air pump 224. An outlet of the aeration device 221 may be submerged into the quantity of water from above the water as illustrated in FIG. 2 so that air from the air pump 224 travels through the aeration device 221 down into the water before exiting the aeration device 221 and generating a bubble in the quantity of water. The outlet of the aeration device 221 may be submerged about ¾ inch into the quantity of water when the quantity of ice is completely melted as indicated by line 301. As portions of the quantity of water freeze to form the quantity of ice, the level of water in the cooling storage tank 215 may increase because ice has a greater volume than water. The increasing level of water may result in the outlet of the aeration device 221 being submerged into the quantity by an increasing distance. In one implementation, the outlet of the aeration device 221 may be submerged about 1.75 inches into the quantity of water when the quantity of water is completely frozen as indicated by line 303. In some implementations, the quantity of water may be maintained so that the quantity of water does not become completely frozen and so that the level of water is between line 301 and line 303 when a maximum quantity (i.e., the amount of ice at which the backup ice storage system 205 stops generating ice) of ice is stored in the ice storage tank 215.

In one embodiment, the aeration device 221 may be disposed in an aeration channel 305. The aeration channel 305 may prevent localized freezing around the aeration device 221. Such localized freezing may interfere with the aeration device 221, for example, by blocking the aeration device 221 with ice.

In one embodiment, the ice monitor 217 may include a pressure sensor 223. The pressure sensor 223 may be configured to measure the amount of pressure exerted by the air pump 224 to expel a gas from the output of the outlet of the aeration device 221 down into the quantity of water. As ice forms and the level of water above the outlet of the aeration device 221 increases, more pressure may be required to expel a gas down into the quantity of water. In one implementation, the ice monitor 217 may be configured to determine a ratio of the quantity of ice to the quantity of water based on the pressure required to expel the gas. The ice monitor 217 may determine the ratio based on one or more stored values, such as an equation, a table of mapped values, etc., which relates pressure exerted to expel the gas to the ratio of the quantity of ice to the quantity of water. In one implementation, the ice monitor may be configured to transmit a representation of the pressure to one or more controllers 237 that may similarly determine the ratio of the quantity of ice to the quantity of water. In other implementations, the ice monitor may include any other device configured to monitor the quantity of ice and/or water.

In some embodiments, the backup cooling storage system 205 may include one or more internal pipes 225. The internal pipes 225 may be configured to direct the liquid between/among the inlet/outlet connections 209 and the components of the backup cooling storage system 205 (e.g., cooling storage tank 215 and liquid cooler 213). The backup cooling storage system 205 may also include one or more valves, each indicated at 227, coupled to the pipes 225. The valves 227 may be configured to control the flow of liquid through the backup cooling storage system 205, as described below. In some implementations, the valves 227 may be controlled by one or more controllers 237 as described below.

In some embodiments, the backup cooling storage system 205 may include at least one liquid pump 229 configured to pump the liquid through the backup cooling storage system 205. The pump 229 may be configured to pump the liquid through the pipes 225 when the main liquid chiller 201 is not operational. The pump 229 may also be configured to pump the liquid through a closed loop such as one used to generate ice in the cooling storage tanks during an ice freeze mode, as described below. In some implementations, the pump 229 may be a bidirectional pump. The pump 229 may be controlled by the one or more controllers 237 as described below.

In some embodiments of the invention, a backup cooling storage system 205 may include and/or be coupled to at least one power supply (not shown). In one implementation, the power source may supply power to the components of the backup cooling storage system 205. The power source may include a utility power source, an uninterruptible power supply, and/or any other power supply. In one implementation, the power supply may include a main power supply and a backup power supply. In one implementation, the main power supply of the backup cooling storage system 205 may be the same power supply used to provide power to the main liquid chiller 201. In such an implementation, if the main power supply and main liquid chiller 201 fail, the backup power supply of the backup cooling storage system 205 may supply power to the backup cooling storage system 205. Because thermal energy is stored in the backup cooling storage system 205 in the form of ice rather than being generated during operation as in the main liquid chiller 201, the power used by the backup cooling storage system 205 may be substantially less than that the power used by the main liquid chiller 201. Because of this lower power usage by the backup cooling storage system 205, sufficient power may be supplied by batteries of other backup power sources that may be insufficient to provide backup power to the main liquid chiller 201. Backup power supplies used to supply power to the backup cooling storage system 205 may supply power without any delay time or with a substantially shorter delay time than the backup power supplies used with the main liquid chiller 201 because of the smaller amount of power needed by the backup cooling storage system 205.

Figure 4:
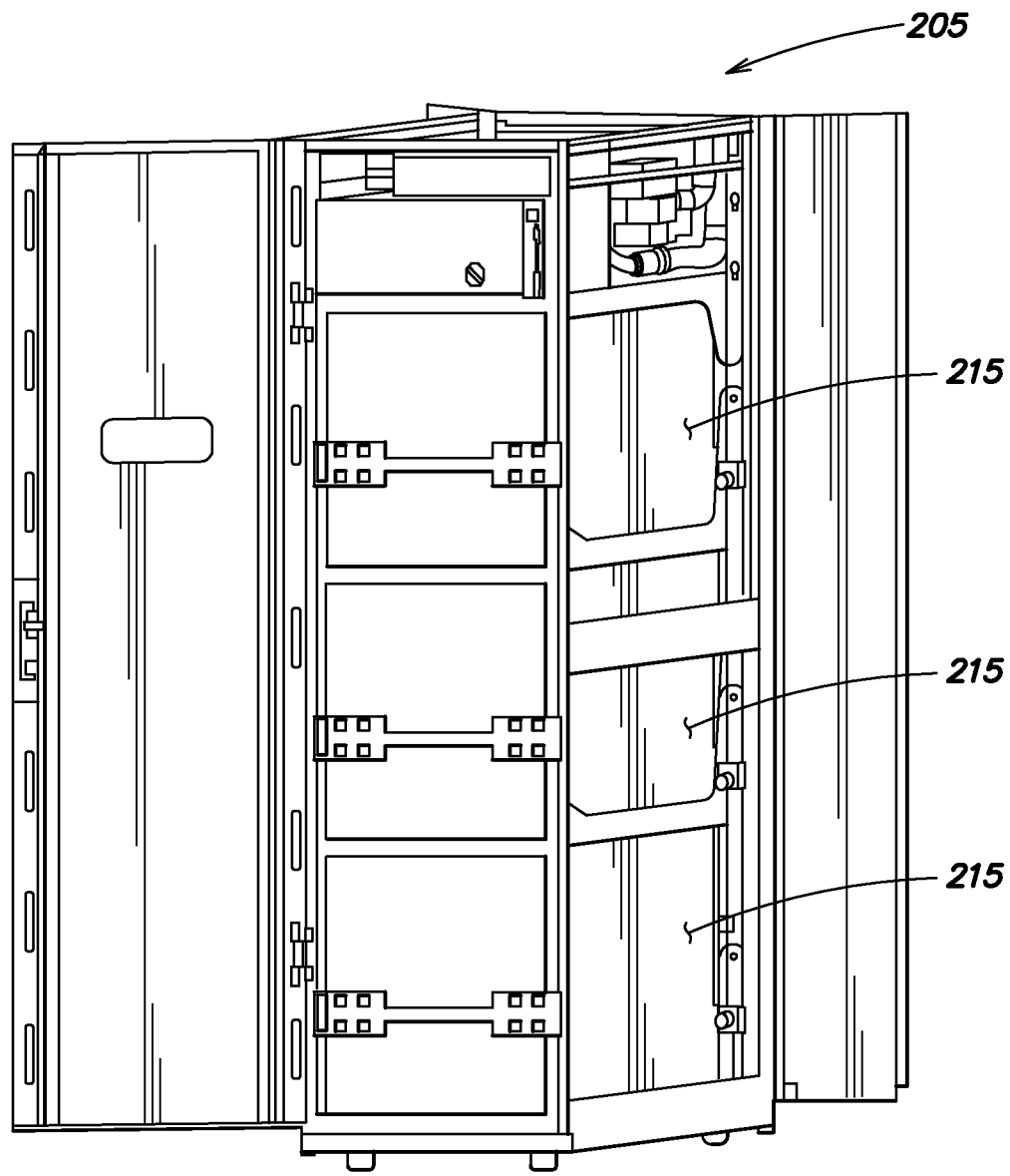
FIG. 4 is a view of a backup cooling storage system in accordance with an embodiment of the invention.

In some embodiments of the invention, the backup cooling storage system 205 may include at least one housing 235. The housing may be configured to store the components of the backup cooling storage system 205. In one embodiment, the housing 235 may be substantially the same size and shape as a computer room electronic equipment rack, such as a standard nineteen-inch rack. FIG. 4 illustrates a perspective view of the backup cooling storage system 205 having a housing 235 comprising a standard nineteen-inch rack.

In some embodiments, the backup cooling storage system 205 may include a strainer 239 coupled to the pipes 225. The strainer may include a standard y-strainer configured to remove any solid contaminant from the liquid traveling through the pipes 225.

In some embodiments, the backup cooling storage system 205 may include a fill/drain valve 241. The fill/drain valve may be used to fill the pipes 225 with liquid upon installation of the backup cooling storage system 205. The fill/drain valve may also be used to empty the pipes of liquid so that the backup cooling storage system 205 may be removed or maintained.

In some embodiments, the backup cooling storage system 205 may include an automatic air eliminator 243. The automatic air eliminator 243 may be configured to remove air and/or any gas in the liquid supply moving through the pipes 225.

In some embodiments, the backup cooling storage system 205 may include an expansion tank 245. The expansion tank may act as a storage tank for excess liquid in the pipes 225. For example, when the temperature of the liquid in the pipes 225 changes, the liquid may expand (e.g., when the liquid warms) and/or contract (e.g., when the liquid cools) in the pipes. The expansion tank 245 may accept excess liquid from the pipes 225 when the liquid in the pipes 225 expands and/or may output stored liquid into the pipes 225 when the liquid in the pipes 225 contracts.

In some embodiments, the backup cooling storage system 205 may include a flow monitor 247. The flow monitor 247 may be configured to monitor a flow of liquid from the cooling storage tanks 215. In some embodiments, the flow monitor 247 may communicate information regarding the flow of liquid to the controller 237. The information may include pressure and/or temperature of the liquid flow. In some implementations, this information may be used to monitor the functionality of the backup cooling storage system (e.g., is there pressure, is the liquid cool enough?). In some implementations, this information may be used to determine the amount of cooling output and/or cooling time remaining in the cooling storage tanks. For example, the information may be used to determine a cooling output (e.g., energy transfer) from the cooling storage tanks based on a volume of liquid passing the fluid monitor and the temperature change of the liquid flow through the cooling storage tanks 215. The cooling output may be monitored and compared to a total cooling output of the cooled material originally stored in the cooling tanks to determine an amount of cooling output and/or cooling time remaining.

In one embodiment, the backup cooling storage system 205 may be modular. In such an embodiment, the backup cooling storage system may include a standard housing, as described above. The inlet/outlet connections 209 in such an embodiment may be configured to connect with a standard inlet/outlet connection of a liquid-based cooling system 200 for a data center room, as discussed above. In such an embodiment, a first backup cooling storage system connected to the liquid-based cooling system 200 may be replaced with a second backup cooling storage system by connecting the second backup cooling storage system to inlet/outlet connections of liquid-based cooling system 200 and disconnecting the first cooling system from inlet/outlet connections of the liquid-based cooling system.

In some embodiments, the backup cooling storage system 205 may be scalable with other backup cooling storage systems. In such embodiments, multiple backup cooling storage systems (e.g., 205) may be connected to a liquid-based cooling system 200 to provide a desired amount of additional emergency backup cooling. In some embodiments, the additional emergency backup cooling may provide a greater cooling output (e.g., when backup cooling storage systems are used to cool liquid simultaneously) and/or a greater cooling time (e.g., when backup cooling storage systems are used to cool liquid sequentially) than a single backup cooling storage system 205. In still other embodiments, the additional emergency backup cooling may provide a combination of additional cooling output and additional cooling time. In one implementation, an administrator may control the multiple backup cooling storage systems using a control panel or other control interface to allocate the additional emergency backup cooling between additional cooling output and additional cooling time. In various embodiments, the backup cooling storage systems may be scalable to generate any amount of cooling output for any amount of cooling time. In some embodiments, the backup cooling storage systems may be scalable between below about ten kilowatts of cooling output to about over ten megawatts of cooling output.

In some embodiments, the backup cooling storage system 205 may be configured to communicate with a number of other backup cooling storage systems or other devices through at least one communication network. The communication network may include wired and/or wireless portions. In one embodiment, communication between/among a plurality of backup cooling storage systems may be used to organize emergency backup cooling when the main liquid chiller is not operational. For example, in one implementation, a first backup cooling storage system of the plurality of backup cooling storage systems may be configured to provide emergency cooling after the main liquid chiller 201 fails. When the first backup cooling storage system depletes its stored quantity of ice, the first cooling storage system may signal a second backup cooling storage system of the plurality of backup cooling storage systems to begin providing emergency backup cooling. This process may continue for any number of backup cooling storage systems so that only one of the plurality of backup cooling storage systems may provide emergency backup cooling at any one time. In other implementations, the plurality of cooling storage systems may be configured so that any desired number of backup cooling storage systems may provide emergency backup cooling at any one time.

In one embodiment, a first backup cooling storage system of the plurality of backup cooling storage systems may be configured to act as a main controller for the rest of the backup cooling storage systems. In one implementation of such an embodiment, the first backup cooling storage system may receive communication from the other backup cooling storage systems identifying stored thermal energy (e.g. a quantity of ice remaining, an amount of time the remaining ice may be used to cool the liquid, an amount of energy available to cool the liquid) in each backup cooling storage system. Based on a desired cooling output and cooling time and the remaining stored thermal energy in each backup cooling storage system, the first backup cooling storage system may generate control signals for each of the backup cooling storage systems.

In other implementations, a main cooling system controller may control the plurality of cooling storage systems rather than the first backup cooling storage system. In one implementation, the main cooling system may include an InfaStruXure Manager available from APC, Corp., West Kingston, R.I. In one implementation, the plurality of backup cooling storage systems may be controlled in accordance with a cooling plan indicating the number of backup cooling storage systems to be used at a time to supply backup cooling to the liquid supplied to the cooling units. In one implementation, the number of cooling storage systems used at a time may be a number needed to provide sufficient cooling to the liquid to prevent thermal damage to the electronic equipment for a desired cooling time. In one embodiment, the plurality of backup cooling storage systems may communicate through an external communication network as discussed below, e.g., by the cooling system of the data center.

To facilitate control of the components of the backup cooling storage system 205, the backup cooling storage system 205 may include at least one controller 237. The controller 237 may receive input from at least one of the sensors 211, ice monitor 217, other backup cooling storage systems, the main liquid chiller 201, the cooling units 203, a user interface, a main cooling system controller, and/or any other desired source. The controller 237 may generate and transmit control signals to control the various operations and components of the backup cooling storage system 205 based at least in part on the input. The controller 237 may be coupled to the various components of the backup cooling storage system 205 by an internal communication network and any external sources of input through an external communication network. The internal and/or external communication networks may include wired and/or wireless portions.

In one embodiment, the backup cooling storage system 205 may communicate with an external communication network. Communication over the external communication network may include control signals, representations of monitored conditions, alarms, and any other information desired to facilitate emergency backup cooling. The external communication network may couple the backup cooling storage system 205 to any other devices, including other backup cooling storage systems, the main liquid chiller 201, the cooling units 203, remote monitors (described below), user interfaces, main cooling control systems, computers, and/or a wide area network such as the Internet. In one implementation, the main cooling control system may transmit control signals over the external communication network to the backup cooling storage system 205 to operate (e.g., provide emergency backup cooling) and/or configure (e.g., set temperature and/or pressure threshold, set alarm conditions) the backup cooling storage system.

In one embodiment, the backup cooling storage system 205 may be configured to trigger an alarm when at least one monitored event occurs. In one implementation, the event may include when the quantity of ice stored by the cooling storage tanks 215 is depleted. In one implementation, the event may include when the main liquid chiller 201 fails. The administrator, in some implementations, may program alarms based on any desired condition of the backup cooling storage system 205. In some implementations, the alarms may include information sent to an administrator or main cooling control system as an SNMP trap and/or an email.

In one implementation, the main liquid chiller 201 may be configured to transmit a signal indicating its operational state or a change in operational state through the external communication network. The signal may include a "heart beat" signal sent periodically from the main liquid chiller 201 indicating that it is operational. In one implementation, the control signal or command may include an operational state update indicating that the main liquid chiller 201 is entering a non-functioning state, such as a maintenance state.

Figure 5A:
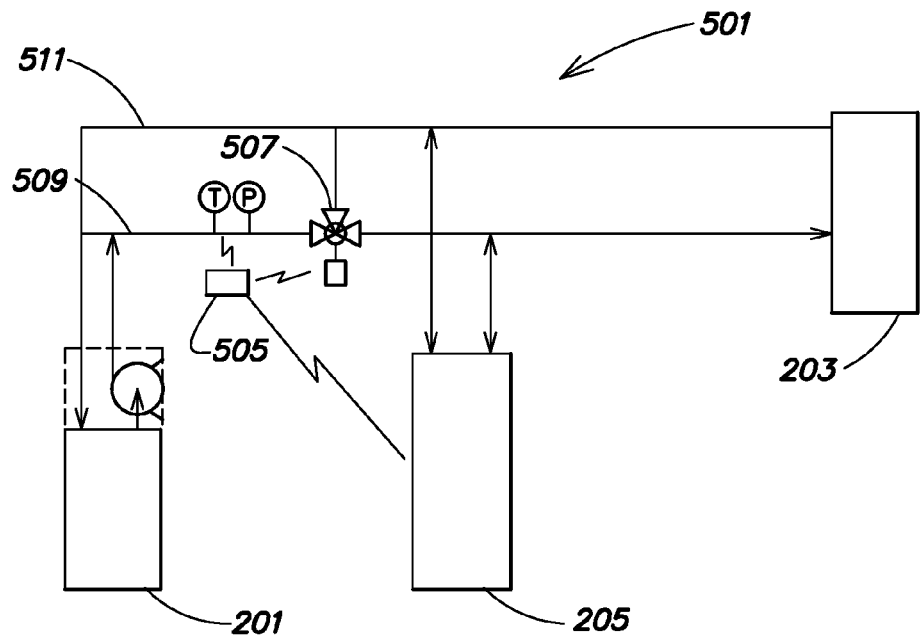
FIGS. 5A and 5B are views of two alternative cooling systems in accordance with embodiments of the invention.
Figure 5B:
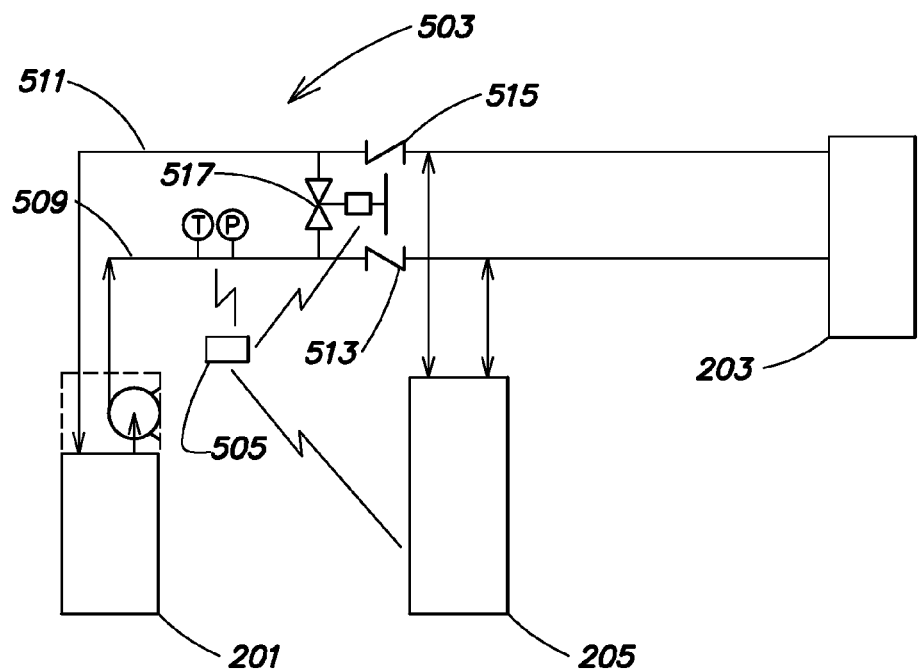

FIGS. 5A and 5B illustrate two additional embodiments of liquid-based cooling systems 501, 503 in accordance with the invention. The cooling systems 501 and 503 each include a remote chiller monitor 505. The remote chiller monitor 505 may be configured to monitor the operational status of the main liquid chiller 201 based on liquid outside of the backup cooling storage system 205. As illustrated, the remote chiller monitor 505 may be disposed closer to the main liquid chiller 201 than the backup cooling storage system 205 and the cooling units 203 supplied by the main liquid chiller 201. The remote chiller monitor 505 may be configured to communicate with the backup cooling storage system 205 (e.g., communicate with the controller 237 of the backup cooling storage system 205) using the communication network described above. Such communication may be used to indicate the operational status to the backup cooling storage system as an alternative or addition to the sensors 211 of FIG. 2.

As illustrated in FIG. 5A, the liquid-based cooling system 501 may include a three way valve 507 coupling a supply pipe 509 to a return pipe 511. When the main liquid chiller 201 is operational, the three way valve 507 may be configured to allow chilled liquid from the main liquid chiller 201 to be supplied through the supply pipe 509 to the cooling units 203, backup cooling storage system 205, and any other devices connected to the liquid-based cooling system 501. When the main liquid chiller 201 stops operating, the three way valve 507 may be configured to isolate the main liquid chiller 201 from the rest of the liquid-based cooling system 501. The backup cooling storage system 205 may then chill the liquid supplied to the cooling units 203 without chilling liquid also supplied to the non-functional main liquid chiller. The remoter chiller monitor 505 may be disposed in the isolated liquid loop to monitor the status of the main liquid chiller 201 so that the three way valve 507 may be opened again when the main liquid chiller 201 is operational again. The three way valve 507 may be coupled to the communication network described above and be controlled by control signals received through the communication network (e.g., from the remote monitor 505, a main cooling system controller (not shown)) or from the controller 237.

As illustrated in FIG. 5B, the liquid-based cooling system 503 may include a bypass valve 517 and two check valves 513, 515. A first check valve 513 may be disposed in a supply pipe 509 of the liquid cooling system 503 closer to the main liquid chiller than the cooling units 203 and backup cooling storage system 205. A second check valve 515 may be disposed in a return pipe 511 of the liquid cooling system 503 close to the main liquid chiller 201 than the cooling units 203 and backup cooling storage system 205. The bypass valve 517 may be disposed closer to the chiller than the first and second check valves to couple the supply pipe 509 and return pipe 511. When the main liquid chiller 201 is operational, the bypass valve 517 may be closed and both check valves 513, 515 may be arranged to allow the liquid to flow to and from the main liquid chiller 201. When the main liquid chiller 201 is not operational, the check valves 513, 515 may be closed to isolate the main liquid chiller 201 and the bypass valve 517 may be opened to create an isolated closed loop. The remote chiller monitor 505 may monitor the liquid in the closed loop to determine the status of the main liquid chiller 201 so that the bypass valve 517 and check valves 513, 515 may be adjusted to supply the liquid to the cooling units 203 again. The bypass valve 517 and two check valves 513, 515 may be controlled by control signals from the communication network similar to the three way valve described above.

Figure 6:
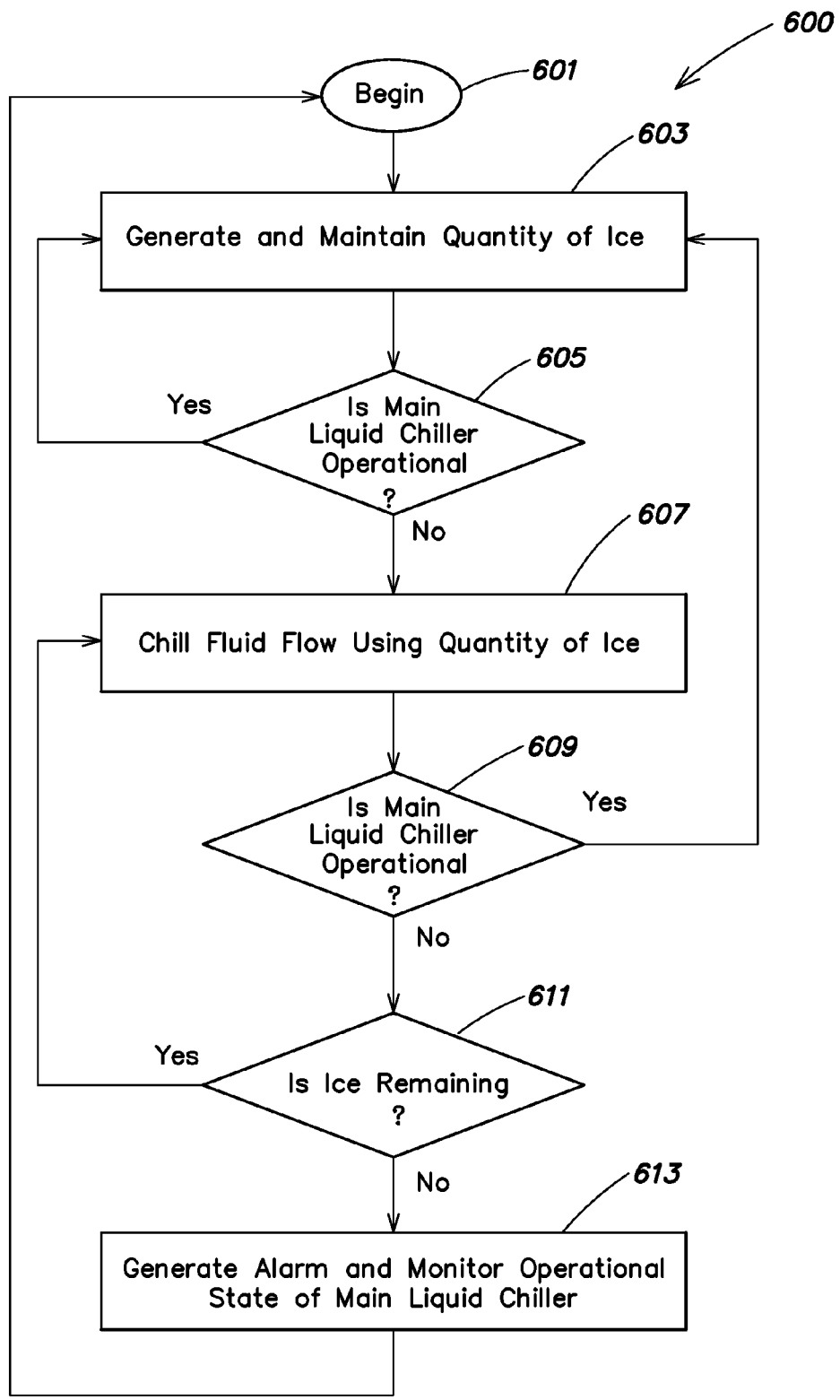
FIG. 6 is a diagram of a process that may be performed by a backup cooling storage system in accordance with an embodiment of the invention.

In operation, some embodiments of the invention may perform a process 600 such as the one diagrammed in FIG. 6. The process 600 may begin at block 601. As indicated in block 603, the backup cooling storage system may generate and maintain the quantity of ice stored in the cooling storage tanks 215 of the backup cooling storage system 205, as shown in FIG. 2.

Figure 7:
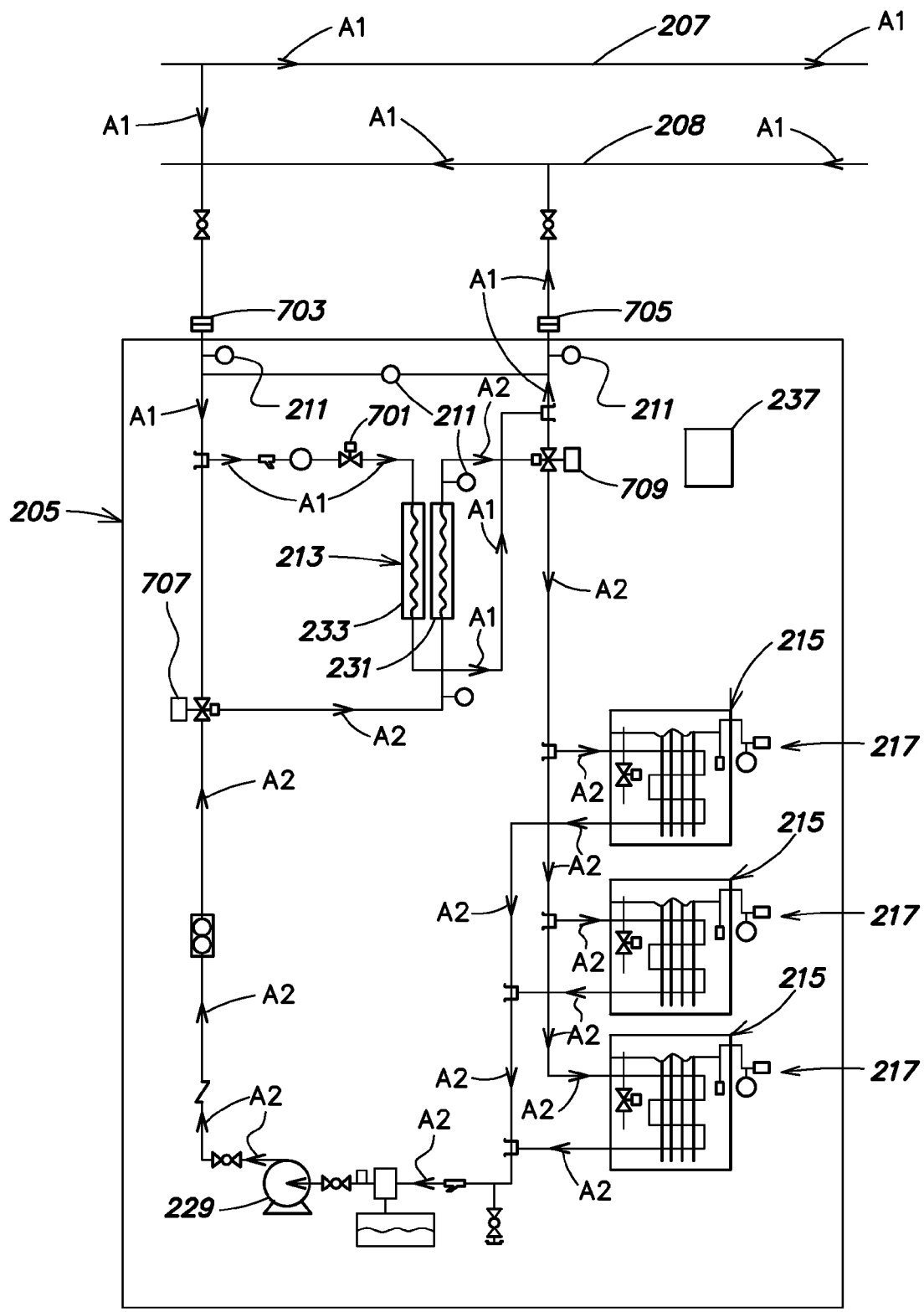
FIG. 7 is a view of a liquid flow through a backup cooling storage system in an ice freeze mode in accordance with an embodiment of the invention.

When initially installed and after exhausting a stored quantity of ice to provide emergency backup cooling, the cooling storage tanks 215 may be filled with only water. The backup cooling storage system 205 may enter an ice freeze mode in which the backup cooling storage system 205 freezes the water to generate the quantity of ice. A flow of liquid through the storage system 205 of FIG. 2 is indicated by arrows A1 and A2 in FIG. 7. In this mode, the valves 701, 707, 709 shown in FIG. 7 may be arranged to supply a liquid flow to a liquid cooler 213 of the backup cooling storage system 205. Specifically, valve 701 may be arranged to allow liquid into the warm side 233 of the thermoelectric chiller 213 from first inlet/outlet connection 703 and out the second inlet/outlet connection 705 as indicated by arrows A1. Valve 707 may be arranged to initially supply liquid to the cold side 231 of the chiller from the first inlet/outlet connection 703. Valve 709 may be arranged to accept the liquid chilled by the chiller and direct it to the cooling storage tanks. When the liquid supplied to the cooling storage tanks reaches valve 707, valve 707 may direct it back to the cool side of the chiller and block liquid coming from the first inlet/outlet connection 703. The pump 229 may be operated to generate a flow of the liquid through the now closed loop between the cooling storage tanks 215 and the cold side 231 of the thermoelectric chiller 213, as indicated by arrows A2. In one implementation the pump 229 may pump about three to about four gallons of liquid per minute in the ice generating mode. In one implementation, valves 709 and 707 may be arranged to operate together and block the flow of liquid from the first connection to the cooling storage tanks immediately upon entering the ice generation mode. In such an implementation, the closed loop may be filled with liquid in each of the three operation modes, so no delay to fill the loop may be needed. In one implementation, although temperature of the liquid supplied to the tanks may begin at about forty-five degrees Fahrenheit (e.g., the temperature supplied by the main chiller), the temperature may be lowered to an approximately steady state of about thirty-one degrees Fahrenheit, and the temperature supplied to the cooling storage tanks 215 may be about twenty-seven degrees Fahrenheit.

The ice monitor 217 may monitor the quantity of ice being created in the cooling storage tank 215 during the ice freeze mode, as described above. When a quantity of ice is generated such that a ratio of ice to water reaches a desired level, the backup cooling storage system 205 may stop generating ice and enter a monitoring mode.

Figure 8:
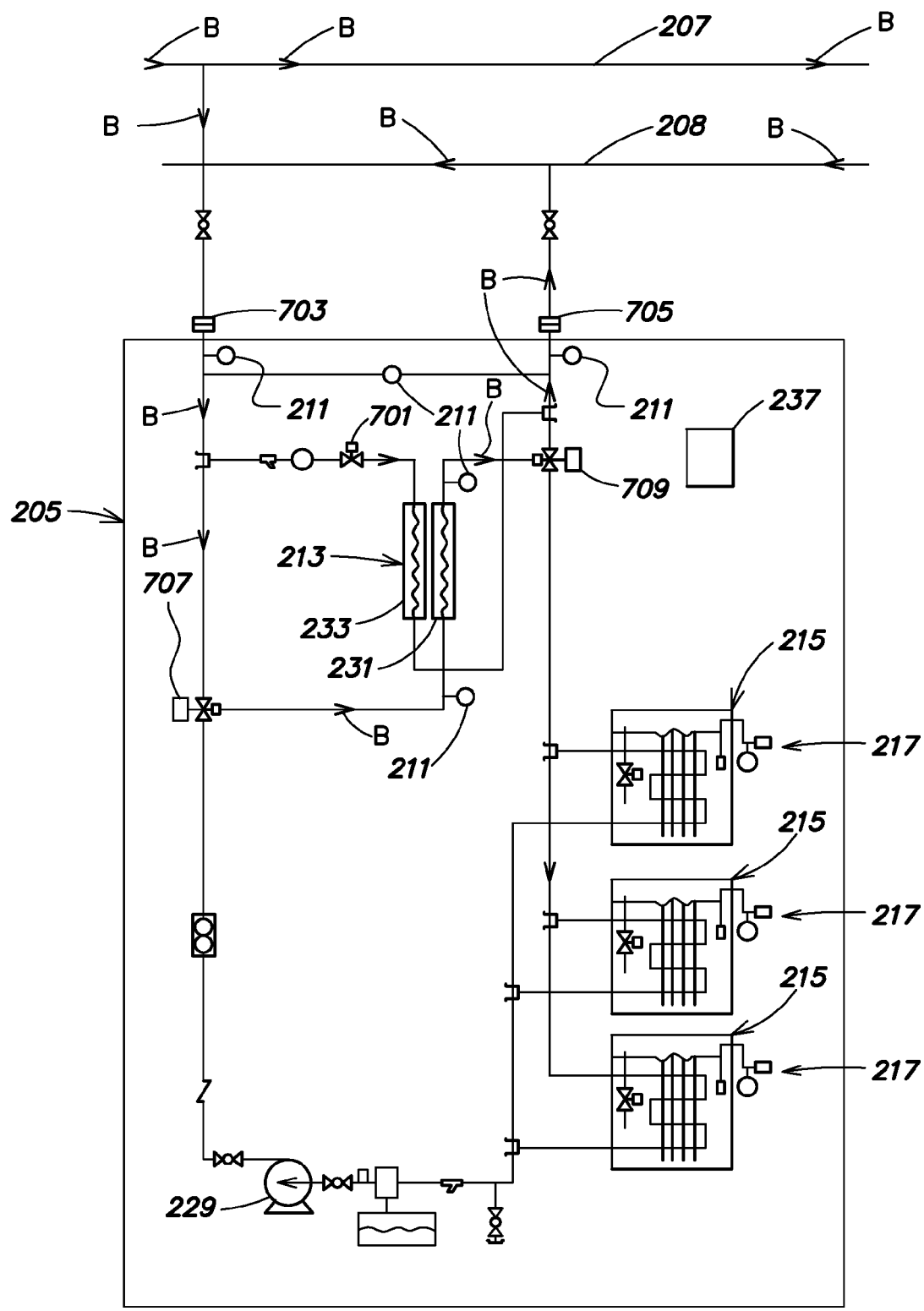
FIG. 8 is a view of a liquid flow through a backup cooling storage system in a monitoring mode in accordance with an embodiment of the invention.

During the monitoring mode, the valves 701, 707, 709 of the backup cooling storage system 205 shown in FIG. 8 may be arranged to allow a relatively small flow of liquid through the backup cooling storage system 205 for monitoring purposes and to disable power supplied to the thermoelectric chiller 213. The liquid flow through the backup cooling storage system 205 of FIG. 2 operating in the ice storage mode is indicated by arrows B in FIG. 8. As illustrated, valve 701 may be arranged to block a liquid flow to the warm side 233 of the thermoelectric chiller 213 from the first inlet/outlet connection 703. Valve 707 may be arranged to allow a flow of liquid to the cold side 231 of the thermoelectric chiller 213 from the first inlet/outlet connection 703. Valve 709 may be arranged to direct liquid from the cold side 231 of the thermoelectric chiller 213 to the second inlet/outlet connection 705. In one embodiment, the valves 701, 707, 709 and pump 229 may be arranged to allow liquid in the closed loop generated in the ice freeze mode to exit the closed loop, for example, by directing liquid received from the pump 229 and storage tank 215 by valve 707 to the cold side 231 of the thermoelectric chiller 213. In other embodiments, the liquid in the closed loop may be maintained so that there may be liquid filling the closed loop when the operational mode changes. In such embodiments, no delay may be required to fill the closed loop with liquid before changing the valve states, as described above. In the ice monitoring mode, the backup cooling storage system 205 may continue to monitor the ice using the ice monitor 217. If, while in this monitoring mode, the ratio of ice to water decreases to below a desired level, the backup cooling storage system 205 may reenter the ice freeze mode and begin to freeze the water again to maintain the desired quantity of ice.

While the backup cooling storage system 205 is in the monitoring mode and the ice freeze mode, the backup cooling storage system 205 may use the flow of liquid to monitor the operational state of the main ice chiller 201, as indicated in block 605. In other implementations, a control signal or command from the main liquid chiller 201, a main cooling system controller, a communication network, a remote chiller monitor 505, and/or an administrator may indicate the operational state of the main liquid chiller 201.

While the main liquid chiller 201 is operational, the backup cooling storage system 205 may continue to maintain and/or generate the quantity or ice. If the main liquid chiller 201, however, stops operating while the backup cooling storage system 205 is operating in the ice freeze mode or the monitoring mode, the backup cooling storage system 205 may begin operating in an emergency mode. In the emergency mode, as indicated in block 607, the backup cooling storage system 205 may be configured to chill the liquid using whatever quantity of ice is then stored in the cooling storage tanks 215. To facilitate this chilling of the liquid, the valves 701, 707, 709 of the backup cooling storage system 205 may be arranged to accept a liquid flow from cooling units 203 and direct that liquid flow through the cooling storage tanks 215 so that it is chilled by the quantity of ice stored in the cooling storage tanks 215.

Figure 9:
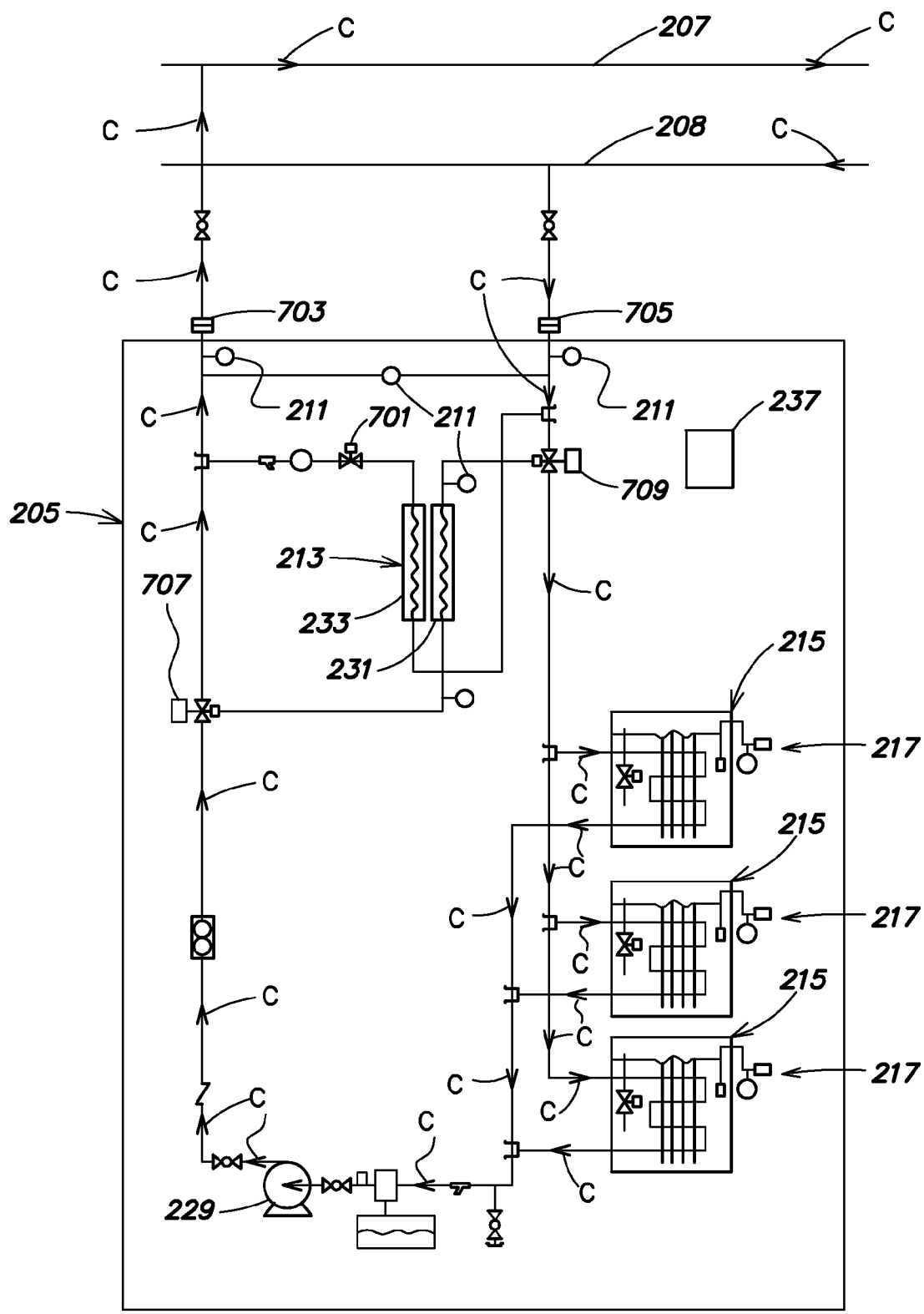
FIG. 9 is a view of a liquid flow through a backup cooling storage system in an emergency mode in accordance with an embodiment of the invention.

The liquid flow through the backup cooling storage system of FIG. 2 is indicated by arrows C illustrated in FIG. 9. In the emergency mode, valve 709 may be arranged to direct liquid from second inlet/outlet connection 705 to the cooling storage tanks 215. Valve 707 may be arranged to direct liquid from the cooling storage tanks 215 to first inlet/outlet connection 703. Valve 701 may be arranged to block liquid flow to the warm side 233 of the thermoelectric chiller 213. Pump 229 may be operated to generate a flow of liquid through the backup cooling storage system 205 from the second inlet/outlet connection 705 through the cooling storage tanks 215 and out through the first inlet/outlet connection 703 to be supplied to the cooling units 203. In one implementation, the pump 229 may pump about 50 gallons of liquid per minute in the emergency state.

During the emergency mode, liquid may be input and output through the opposite inlet/outlet connections 703, 705 than in the monitoring and ice freeze modes. This reversal of liquid supply may be needed because the backup cooling storage system 205 may accept and exhaust a liquid supply to/from the main liquid chiller 201 in the ice freeze and monitoring modes, but the backup cooling storage system 205 may accept and exhaust a liquid supply to/from the cooling units 203 in the emergency mode.

During the emergency mode, the backup cooling storage system 205 may continue to monitor the operational status of the main liquid chiller as indicated by block 609. This monitoring may be performed by the sensors 211, as described above. For example, in one implementation, the sensors 211 may monitor for an increase in pressure and/or a decrease in liquid temperature supplied from the cooling units indicating that the main liquid chiller 201 is operational. In another implementation, remote chiller monitors 505 may monitor the state of the main liquid chiller 201 and communicate the state to a controller of the backup cooling storage system 205. If the main liquid chiller 201 becomes operational again, the backup cooling storage system 205 may return to generating and maintaining the quantity of ice in block 601. When the main liquid chiller 201 is not operational, the backup cooling storage system 205 may continue to chill the liquid while monitoring the level of ice as indicate in block 611.

If the ice melts while the main liquid chiller 201 is still not operational, the backup cooling storage system 205 may stop chilling the liquid. Such an event may result in a thermal event causing failure or damage to the electronic equipment stored in the cooling units 203. As indicated in block 613, to warn an administrator of an immanent thermal event, the backup cooling storage system 201 may generate one or more alarms such as those described above. Also as indicated in block 613, the backup cooling storage system 205 may continue to monitor the operational state of the main liquid chiller 201 and begin the process again when the main liquid chiller 201 begins operating again.

Although in the illustrated embodiment cooling storage tanks 215 in the backup cooling storage system 205 are treated as one cooling storage tank, the cooling storage system 215 may be configured to operate each cooling storage tank individually. In such an embodiment, each cooling storage tank may include an individually controllable valve connecting it to the internal pipes 225. The individually controllable valve may control flow of liquid through each cooling storage tank 215 individually. By individually controlling the liquid flow through the cooling storage tanks 215, ice may be generated in one cooling storage tank 215 at a time and/or one cooling storage tank at a time may be used to provide backup emergency cooling when the main liquid chiller 201 is not operating.

It should be understood that embodiments of the invention are not limited to cooling systems. Rather, embodiments of the invention may be configured to supply backup heat storage or a combination of backup heat and cooling storage. In such embodiments, the backup cooling storage systems may be replaced and/or supplemented by backup heat storage systems. Such backup heat storage systems may include heat storage tanks. Similar to the backup cooling storage tanks, the heat storage tanks may be configured to store a composition that is heated while a main heating element is operational and to use the heated composition to supply heat when the main heating element is not operational. In one implementation, the composition used in such heating storage tanks may be water. In other implementations, the composition may be another substance that is in a liquid or solid state at the temperature normally produced by the main heating element. In such implementations, the composition may be stored in a gaseous or liquid state when the main heater is operational. To generate heat, the gas or liquid may change state to liquid or solid when the main heater element is not operational, similar to the state change from ice to water described above.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:
1. A cooling system comprising:
at least one cooling unit configured to cool a portion of a data center;
a main chilling unit separate from the at least one cooling unit and configured to cool a liquid supply in fluid communication with the at least one cooling unit, the arrangement being such that the main chilling unit is configured to supply cool liquid to the at least one cooling unit and receive warm liquid from the at least one cooling unit; and at least one backup cooling unit configured to generate and maintain a quantity of cooled material using the liquid supply when the main chilling unit is operational and configured to cool the liquid supply using the quantity of cooled material when the main chilling unit is not operational, the at least one backup cooling unit includes at least one chiller configured to further cool at least a portion of the liquid supply to generate and maintain the quantity of cooled material when the main chilling unit is operational, wherein the at least one chiller includes at least one thermoelectric chiller.

2. The system of claim 1, wherein the liquid supply includes at least one of a composition comprising water and a composition comprising glycol.

3. The system of claim 1, wherein the at least one backup cooling unit is configured to generate and maintain the quantity of cooled material when a temperature of the liquid supply is below a threshold value, and wherein the at least one backup cooling unit is configured to cool the liquid supply when the temperature of the liquid supply is above the threshold value.

4. The system of claim 1, wherein the at least one backup cooling unit includes at least one storage tank configured to store the quantity of cooled material.

5. The system of claim 4, wherein the quantity of cooled material includes a quantity of a first portion of the cooled material and a quantity of a second portion of the cooled material, the first portion being a liquid portion of the cooled material, and the second portion being a solid portion of the cooled material.

6. The system of claim 5, wherein the first portion includes water and the second portion includes ice.

7. The system of claim 1, wherein the at least one backup cooling unit includes at least one liquid directing element configured to direct at least a portion of the liquid supply through the at least one backup cooling unit so that heat transfers between at least the portion of the liquid supply and the quantity of cooled material.

8. The system of claim 1, wherein the main chilling unit and backup cooling unit are further configured to provide the liquid supply to a cooling system.

9. The system of claim 1, wherein the at least one backup cooling unit is housed in at least one standard rack.

10. The system of claim 1, wherein each backup cooling unit of the at least one cooling unit is configured to generate a cooling output over a cooling period.

11. The system of claim 10, wherein the at least one backup cooling unit includes a desired number of ice storage elements corresponding to a total desired cooling output and a total desired cooling period.

* * * * *